(12) United States Patent
Sakata et al.

(10) Patent No.: US 8,883,554 B2
(45) Date of Patent: Nov. 11, 2014

(54) METHOD FOR MANUFACTURING A SEMICONDUCTOR DEVICE USING AN OXIDE SEMICONDUCTOR

(75) Inventors: Junichiro Sakata, Kanagawa (JP); Tadashi Serikawa, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1124 days.

(21) Appl. No.: 12/639,115

(22) Filed: Dec. 16, 2009

(65) Prior Publication Data
US 2010/0155719 A1    Jun. 24, 2010

(30) Foreign Application Priority Data
Dec. 19, 2008    (JP) .................. 2008-323297

(51) Int. Cl.
H01L 21/00    (2006.01)
H01L 27/12    (2006.01)
H01L 29/786    (2006.01)

(52) U.S. Cl.
CPC ........ H01L 29/7869 (2013.01); H01L 27/1225 (2013.01)
USPC .................. 438/104; 257/43; 257/59

(58) Field of Classification Search
USPC ........................ 257/43, 59; 438/104
See application file for complete search history.

(56) References Cited

U.S. PATENT DOCUMENTS

| | | |
|---|---|---|
| 5,530,265 A | 6/1996 | Takemura |
| 5,696,011 A | 12/1997 | Yamazaki et al. |
| 5,731,856 A | 3/1998 | Kim et al. |
| 5,744,864 A | 4/1998 | Cillessen et al. |
| 5,847,410 A | 12/1998 | Nakajima |
| 6,022,764 A | 2/2000 | Park et al. |
| 6,294,274 B1 | 9/2001 | Kawazoe et al. |
| 6,424,012 B1 * | 7/2002 | Kawasaki et al. ............. 257/350 |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(Continued)

*Primary Examiner* — Howard Weiss
*Assistant Examiner* — Tifney Skyles
(74) *Attorney, Agent, or Firm* — Eric J. Robinson; Robinson Intellectual Property Law Office, P.C.

(57) ABSTRACT

In a manufacturing process of a semiconductor device formed using a thin film transistor, an object is to provide a technique by which the number of photomasks can be reduced, manufacturing cost can be reduced, and improvement in productivity and reliability can be achieved. A main point is that a film forming a channel protective layer is formed over an oxide semiconductor layer having a light-transmitting property, a positive photoresist is formed over the film forming a channel protective layer, and a channel protective layer is selectively formed over a channel formation region in the oxide semiconductor layer by using a back surface light exposure method.

13 Claims, 21 Drawing Sheets

(56) References Cited

U.S. PATENT DOCUMENTS

| | | |
|---|---|---|
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,888,681 B2 | 2/2011 | Yamazaki et al. |
| 7,910,920 B2 | 3/2011 | Park et al. |
| 8,467,825 B2 * | 6/2013 | Kato et al. .................. 455/550.1 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0059650 A1 * | 3/2009 | Saito .............................. 365/148 |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| EP | 2226847 A | 9/2010 |
| EP | 2264770 A | 12/2010 |
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 | 3/2003 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2005-285890 A | 10/2005 |
| JP | 2006-100760 A | 4/2006 |
| JP | 2007-096055 | 4/2007 |
| JP | 2007-123861 | 5/2007 |
| JP | 2007-150158 A | 6/2007 |
| JP | 2007-250983 A | 9/2007 |
| JP | 2007-311404 A | 11/2007 |
| JP | 2008-060419 | 3/2008 |
| JP | 2008-060419 A | 3/2008 |
| WO | WO-2004/114391 | 12/2004 |
| WO | WO-2006/025609 | 3/2006 |
| WO | WO-2007/119386 | 10/2007 |

(56) References Cited

FOREIGN PATENT DOCUMENTS

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.
Kanno.H et al., "White Stacked Electrophosphorecent Organic Light-Emitting Device Employing MOO3 as a change-Generator Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Jeong.J at al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW'09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, pp. 1249-1252.
Godo.H at al., "Temperature Dependence of Characteristics and Electronic Structure for Amorphous In—Ga—Zn—Oxide TFT,", AM-FPD'09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T at al., "Novel Top-Gate Zinc Oxide Thin-Film Transistors (ZnO TFTS) for AMLCDS,", Journal of the SID , 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "58.2 Invited Paper : Suftla Flexible Microelectronics on Their Way to Business,", SID Digest '07 : SID International Symposium Digest of Technical Papers, 2007, vol. 38, pp. 1673-1676.
Chern.H at al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest or Technical Papers, 2007, vol. 38, pp. 1737-1740.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,$YbFe_2O_4$, and $Yb_2Fe_3O_7$ Types of Structures for Compounds in the $In_2O_3$ and $Sc_2O_3$—$A_2O_3$—BO Systems [A:Fe, Ga, or Al; B: Mg, Mn, Fe, Ni, Cu, or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
International Search Report (Application No. PCT/JP2009/071067) Dated Feb. 9, 2010.
Written Opinion (Application No. PCT/JP2009/071067) Dated Feb. 9, 2010.
Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

(56) References Cited

OTHER PUBLICATIONS

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al. "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Eelctrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, 1991, vol. 93, pp. 298-315.

Kimizuka et al., "Syntheses and Single-Crystal Data of Homologous Compounds, $In_2O_3(ZnO)_m$, (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, 1995, vol. 116, pp. 170-178.

Nomura et al., "Room-Temperature Fabrication of Transparent Flexible Thin-Film Transistors Using Amorphous Oxide Semiconductors," Nature, Nov. 2004, vol. 432, pp. 488-492.

Nomura et al., "Thin-Film Transistor Fabricated in Single-Crystalline Transparent Oxide Semiconductor," Science, May 23, 2003, vol. 300, pp. 1269-1272.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Nakamura et al., "Syntheses and crystal structures of new homologous compounds, indium iron zinc oxides (InFeO3(ZnO)m) (m natural number) and related compounds,", Kotai Butsuri (Solid State Physics), 1993, vol. 28, No. 5, pp. 317-327.

* cited by examiner

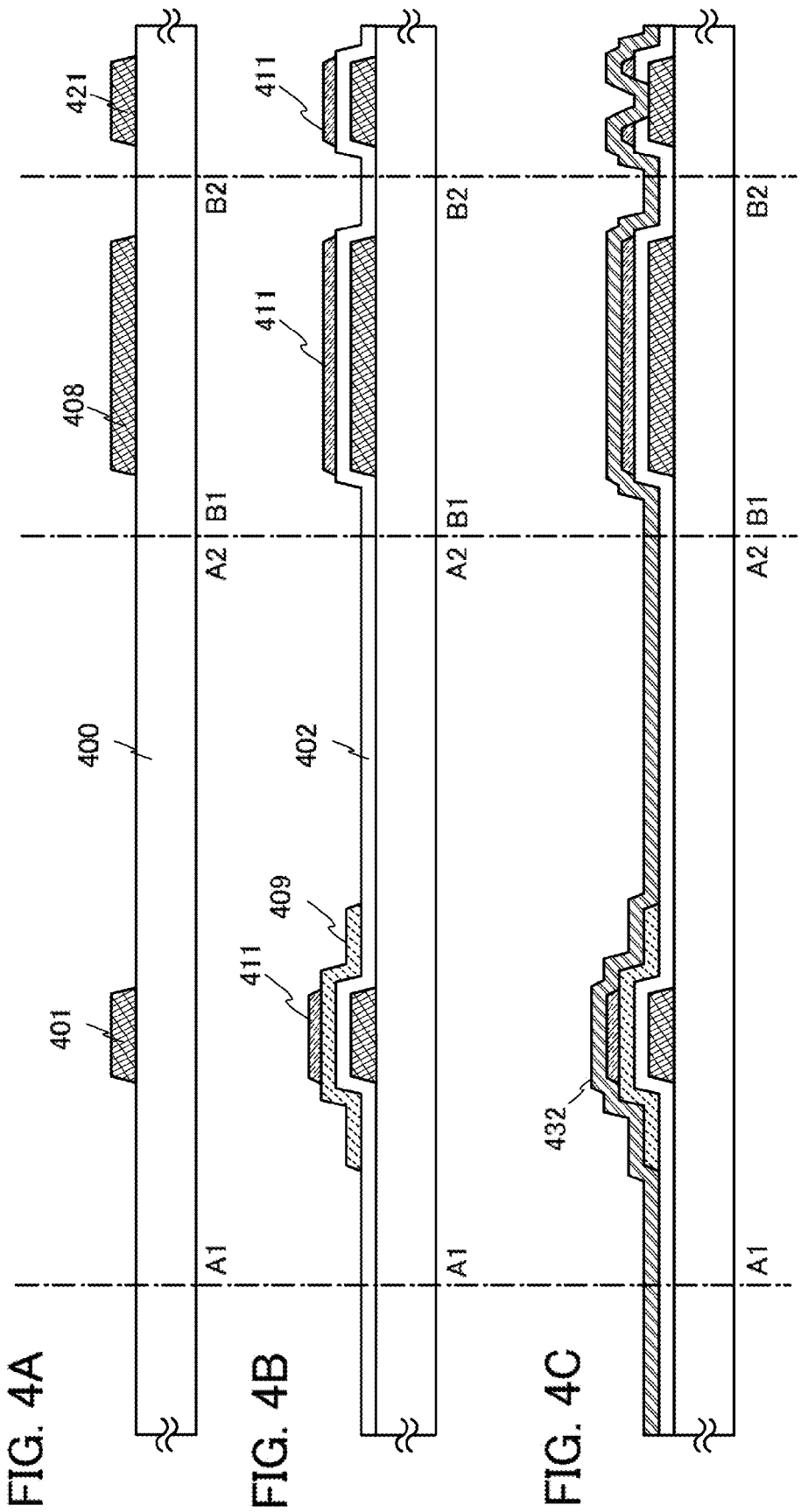

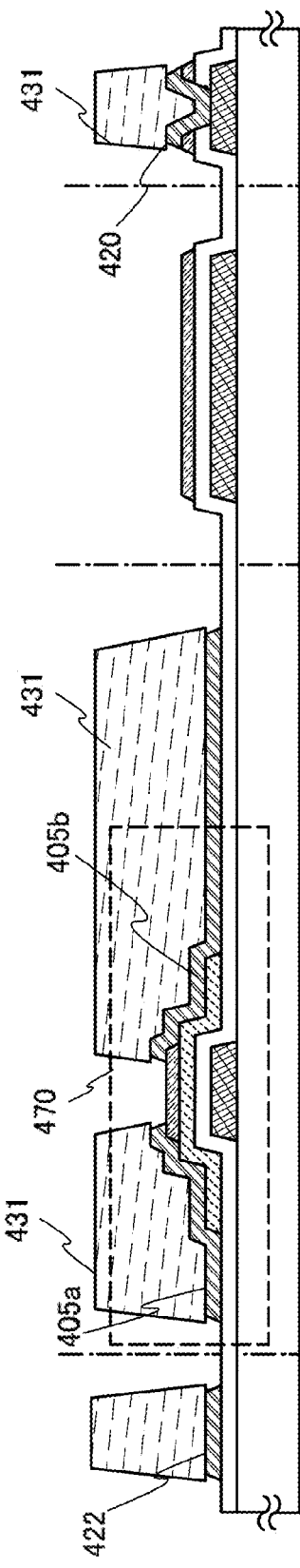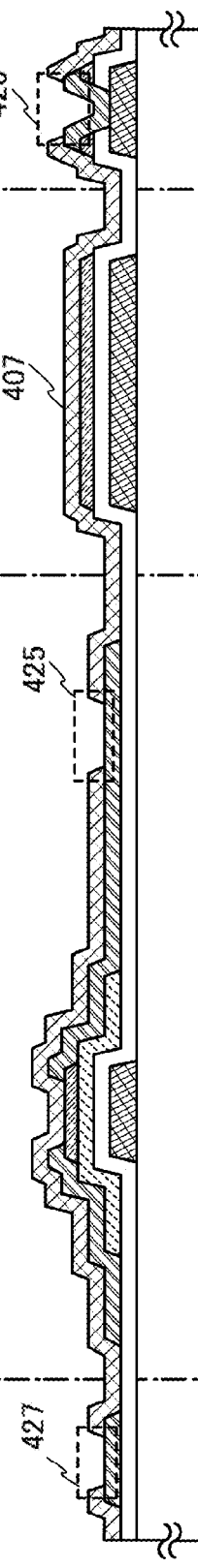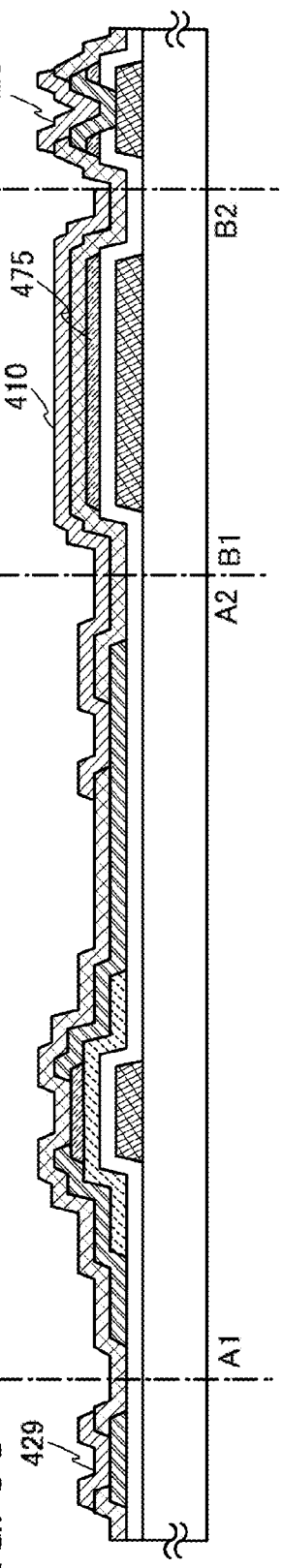

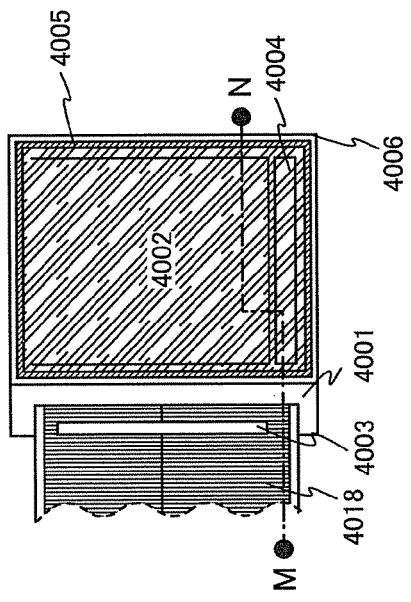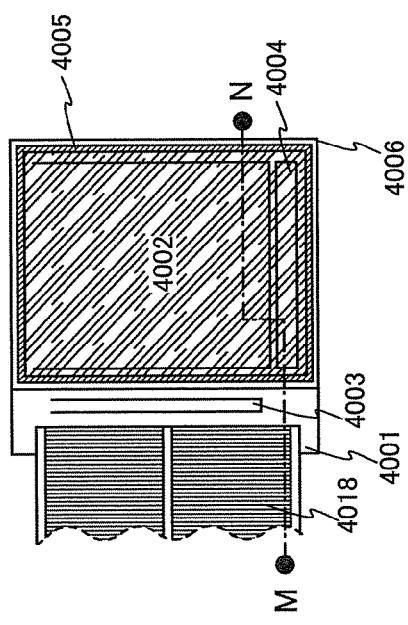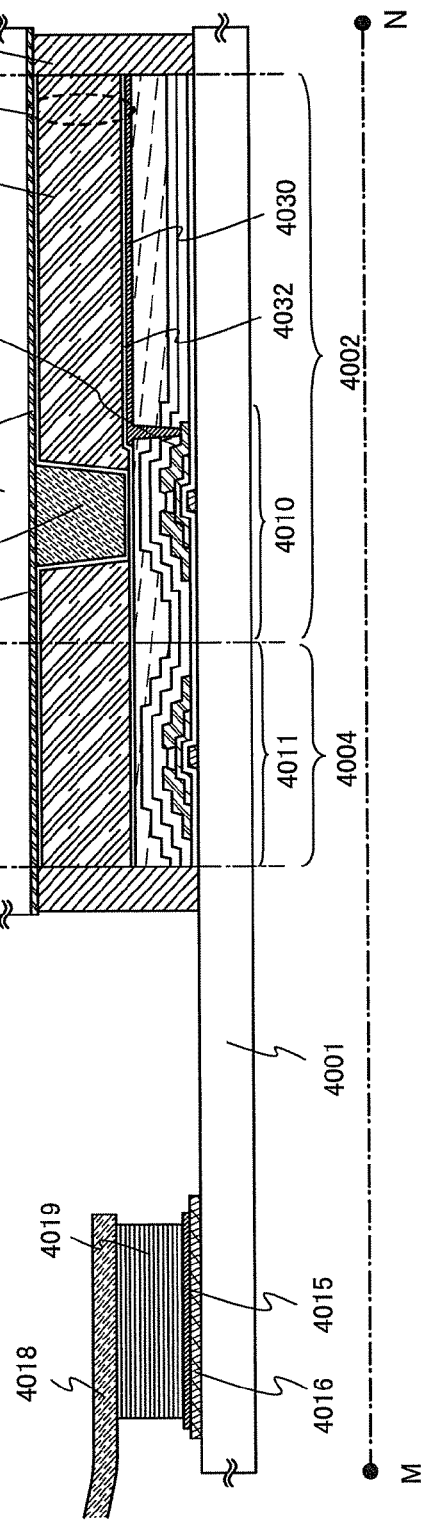

US 8,883,554 B2

METHOD FOR MANUFACTURING A SEMICONDUCTOR DEVICE USING AN OXIDE SEMICONDUCTOR

TECHNICAL FIELD

The present invention relates to a semiconductor device using an oxide semiconductor and a method for manufacturing the semiconductor device.

Note that in this specification, a semiconductor device indicates any device which can function by utilizing semiconductor characteristics.

BACKGROUND ART

There are various kinds of metal oxides, which are used for a wide range of applications. Indium oxide is a well-known material and used for a material of a transparent electrode which is needed in a liquid crystal display or the like.

Some metal oxides have semiconductor characteristics. The metal oxides having semiconductor characteristics are one kind of compound semiconductor. The compound semiconductor is a semiconductor formed using two or more kinds of atoms bonded together. In general, metal oxides become insulators; however, it is known that metal oxides become semiconductors depending on the combination of elements included in the metal oxides.

For example, tungsten oxide, tin oxide, indium oxide, zinc oxide, and the like are known to show semiconductor characteristics among metal oxides. A thin film transistor in which a transparent semiconductor layer formed of such a metal oxide is used for a channel formation region is disclosed (Patent Documents 1 to 4 and Non-Patent Document 1).

As the metal oxides having semiconductor characteristics, not only the above-described mono-component oxides but also multi-component oxides are known. For example, $InGaO_3(ZnO)_m$ (m is a natural number) having a homologous series is a known material (Non-Patent Documents 2 to 4).

Further, it is proved that the homologous thin film described above can be used for a channel layer of a thin film transistor (Patent Document 5 and Non-Patent Documents 5 and 6).

In addition, Patent Document 6 and Patent Document 7 disclose a technique by which a thin film transistor is manufactured using zinc oxide or an In—Ga—Zn—O-based oxide semiconductor as a metal oxide semiconductor and such a transistor is used as a switching element or the like of an image display device.

REFERENCES

Patent Documents

[Patent Document 1] Japanese Published Patent Application No. S60-198861
[Patent Document 2] Japanese Translation of PCT international Application No. H11-505377
[Patent Document 3] Japanese Published Patent Application No. H8-264794
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-96055

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGa_3(ZnO)_3$, and $Ga_2O_3(ZnO)_m$, (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

DISCLOSURE OF INVENTION

The field effect mobility of a thin film transistor using a metal oxide semiconductor (hereinafter, referred to as an oxide semiconductor) for a channel formation region is higher than that of a thin film transistor using amorphous silicon. An oxide semiconductor film can be formed by sputtering or the like at a temperature of 300° C. or lower, and a manufacturing process thereof is simpler than that of a thin film transistor using polycrystalline silicon.

Such an oxide semiconductor is expected to be used for forming a thin film transistor on a glass substrate, a plastic substrate, or the like, and to be applied to a liquid crystal display device, an electroluminescent display device, electronic paper, and the like.

A thin film transistor formed using an oxide semiconductor can form a high-performance semiconductor device; however, there is still room for improvement in manufacturing cost as compared to a thin film transistor using amorphous silicon.

Therefore, an object of the present invention is to provide a technique for cutting down the number of photomasks to reduce manufacturing cost, and at the same time, improving productivity and reliability of a semiconductor device, in a manufacturing process of a semiconductor device formed using a thin film transistor.

According to an embodiment of the present invention, a film forming a channel protective layer is formed over an oxide semiconductor layer having a light-transmitting property, a positive photoresist is formed over the film forming a channel protective layer, and a channel protective layer is selectively formed over a channel formation region in the oxide semiconductor layer by using a back surface light exposure method. In particular, an embodiment of the present invention is a method for manufacturing a semiconductor device including the steps of: forming a gate electrode layer having a light-blocking property over a light-transmitting substrate; forming a gate insulating film having a light-transmitting property over the gate electrode layer; forming an oxide semiconductor layer having a light-transmitting property over the gate insulating film; forming an insulating layer having a light-transmitting property over the oxide semiconductor layer; forming a positive photosensitive thin film over the insulating layer; irradiating the photosensitive thin film with light from a light source on a substrate side to expose the photosensitive thin film to light; removing an exposed region of the photosensitive thin film by development; forming a channel protective layer by etching the insulating layer with the use of an unexposed region of the photosensitive thin film as a mask; and forming a wiring layer over the oxide semiconductor layer.

Another embodiment of the present invention is a method for manufacturing a semiconductor device including the steps of: forming a gate electrode layer having a light-blocking property over a light-transmitting substrate; forming a gate insulating film having a light-transmitting property over the gate electrode layer; forming an oxide semiconductor layer having a light-transmitting property over the gate insulating film and an insulating layer having a light-transmitting property over the oxide semiconductor layer successively; forming a positive photosensitive thin film over the insulating layer; irradiating the photosensitive thin film with light from a light source on a substrate side to expose the photosensitive thin film to light; removing an exposed region of the photosensitive thin film by development; forming a channel protective layer by etching the insulating layer with the use of an unexposed region of the photosensitive thin film as a mask; forming an island-shaped oxide semiconductor layer from the oxide semiconductor layer; and forming a wiring layer over the island-shaped oxide semiconductor layer.

Another embodiment of the present invention may be a method for manufacturing a semiconductor device, in which an oxide semiconductor layer is a thin film represented by $InMO_3(ZnO)_m$ (m>0) and M denotes one or more of gallium, iron, nickel, manganese, and cobalt.

Another embodiment of the present invention may be a method for manufacturing a semiconductor device, in which an oxide semiconductor layer is formed by a sputtering method.

Another embodiment of the present invention may be a method for manufacturing a semiconductor device, in which reverse sputtering using an argon gas is performed on a surface of the gate insulating film before formation of an oxide semiconductor layer.

Another embodiment of the present invention may be a method for manufacturing a semiconductor device, in which heat treatment at 200° C. to 600° C. is performed on an oxide semiconductor layer.

Another embodiment of the present invention may be a method for manufacturing a semiconductor device, in which heat treatment is performed in an air atmosphere or a nitrogen atmosphere.

Another embodiment of the present invention may be a method for manufacturing a semiconductor device, in which a channel protective layer is an insulating film including oxygen.

Another embodiment of the present invention may be a method for manufacturing a semiconductor device, in which an oxide semiconductor layer is etched to form an island-shaped oxide semiconductor layer.

According to the present invention, reduction in the number of photomasks and in manufacturing cost can be achieved. In addition, the amount of photoresist used in a photolithography process can be reduced, and improvement in productivity can be expected because of reduction in the number of manufacturing steps. Further, improvement in reliability of a thin film transistor can be expected by using an oxide semiconductor.

BRIEF DESCRIPTION OF DRAWINGS

In the accompanying drawings:
FIGS. 4A to 4C are diagrams illustrating Embodiment 3;
FIGS. 5A to 5C are diagrams illustrating Embodiment 3;
FIGS. 17A, 17B, and 17C are diagrams illustrating Embodiment 6.

BEST MODE FOR CARRYING OUT THE INVENTION

Figure 1A:
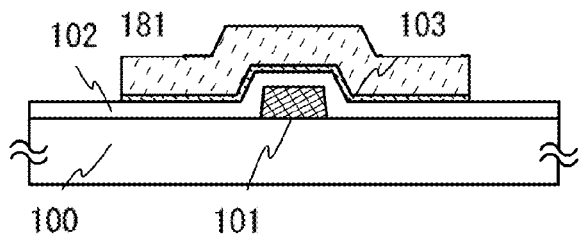
FIGS. 1A to 1F are diagrams illustrating Embodiment 1.

Embodiments of the present invention will be described in detail with reference to the accompanying drawings. However, the present invention is not limited to the following description, and it is to be easily understood by those skilled in the art that the modes and their details of the present invention can be changed in various ways without departing from the spirit and the scope of the present invention. Therefore, the present invention should not be interpreted as being limited to the description of the following embodiments. Note that, in the structure of the present invention described hereinafter, the same reference numerals denote the same parts or parts having the similar functions in different drawings and the explanation will not be repeated.
(Embodiment 1)

In Embodiment 1, a thin film transistor formed using an oxide semiconductor and a manufacturing method thereof are described with reference to drawings.

First, a first conductive layer is formed using a light-blocking material over a light-transmitting substrate 100 and is subjected to patterning using a first photomask to form a gate electrode layer 101. A gate insulating film 102 having a light-transmitting property is formed over the gate electrode layer 101. An oxide semiconductor layer is formed over the gate insulating film 102 and is subjected to patterning using a second photomask to form an island-shaped oxide semiconductor layer 103 so as to cover the gate electrode layer 101 under the gate insulating film 102 (see FIG. 1A). Note that the island-shaped oxide semiconductor layer 103 is formed so that it has an island shape by a resist mask 181 formed using a second photomask.

Note that patterning is to process a film shape, which means to form a mask pattern (also referred to as a light-blocking pattern) of a film by a photolithography process including a series of steps such as formation of a photoresist, light exposure, development, an etching step, a resist removal step, cleaning, and inspection. That is, patterning means to remove unnecessary part of a layer formed over a substrate so that the layer is processed into a desired shape.

Note that a photoresist is not necessarily applied over an entire surface of the film to be processed. Alternatively, a pattern bigger than a mask pattern to be formed may be formed by a screen printing method or an ink-jet method in advance. A photoresist is formed in advance into a pattern bigger than a mask pattern to be formed and the photoresist is processed into a desired shape by a photolithography process or the like, whereby the amount of photoresist which is removed by development can be reduced. Therefore, cost reduction in manufacturing a semiconductor device can be achieved.

Note that terms such as first, second, third, and Nth (N is a natural number) employed in this specification are used in order to avoid confusion between components and do not set a limitation on number.

As the substrate 100, a light-transmitting substrate which has a light transmittance of 80% or more, preferably 90% or more, with respect to light used in light exposure of resist in a later step is used. For example, a glass substrate, a quartz substrate, a ceramic substrate, or a resin substrate such as polyethylene terephthalate (PET) is used.

Note that an insulating layer may be formed over the substrate 100. The insulating layer is formed of a single layer or a stacked layer using an oxide material containing silicon or a nitride material containing silicon by a method such as a CVD method, a plasma CVD method, a sputtering method, or a spin coating method. Although this insulating layer is not necessarily formed, it has the effect of blocking a contaminant or the like from the substrate 100.

Further, the gate electrode layer 101 is formed using a material having a light-blocking property with respect to light used in light exposure of a resist in a later step. Specifically, the gate electrode layer 101 is formed using a material having a light transmittance less than 10% with respect to light used in light exposure of the resist in the later step, and the film thickness is adjusted as appropriate. The gate electrode layer 101 is formed using a metal material such as titanium, molybdenum, chromium, tantalum, tungsten, or aluminum, or an alloy material thereof. The gate electrode layer 101 can be formed in such a manner that a conductive film is formed over the substrate 100 by a sputtering method or a vacuum evaporation method; a mask is formed over the conductive film by a photolithography process or an ink-jet method; and the conductive film is etched using the mask. Alternatively, the gate electrode layer 101 can be formed by discharging a conductive nanopaste of silver, gold, copper, or the like by an ink-jet method and baking the conductive nanopaste. Further, the gate electrode layer 101 may have either a single-layer structure or a stacked-layer structure. For example, a stacked layer can be used, in which a molybdenum film and an aluminum film, a molybdenum film and an alloy film of aluminum and neodymium, a titanium film and an aluminum film, or a titanium film, an aluminum film, and a titanium film are stacked from the substrate 100 side.

When the gate electrode layer 101 is processed by etching, a mask may be formed and dry etching or wet etching may be performed. The electrode layer can be etched into a tapered shape by using an ICP (inductively coupled plasma) etching method and appropriately adjusting the etching condition (e.g., the amount of electric power applied to a coiled electrode, the amount of electric power applied to an electrode on a substrate side, or the temperature of the electrode on the substrate side). As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

As the gate insulating film 102, an insulating film having a light-transmitting property with respect to light used in light exposure of a photoresist in a later step is used. For example, the gate insulating film 102 is formed using a silicon oxide film, a silicon nitride film, a silicon oxynitride film, or a silicon nitride oxide film. Note that the gate insulating film can be formed to have a two-layer structure of a silicon oxide film, a silicon nitride film, a silicon oxynitride film, or a silicon nitride oxide film, instead of a single-layer structure. Alternatively, the gate insulating film may be formed to have a three-layer structure. Further, the gate insulating film 102 can be formed using, for example, a metal compound such as aluminum oxide, magnesium oxide, aluminum nitride, yttrium oxide, or hafnium oxide.

Here, a silicon oxynitride film means a film that contains oxygen and nitrogen so that the amount of oxygen is larger than that of nitrogen and, in the case where measurements are performed using Rutherford backscattering spectrometry (RBS) and hydrogen forward scattering (HFS), contains oxygen, nitrogen, Si, and hydrogen at concentrations ranging from 55 to 70 at. %, from 0.5 to 15 at. %, from 25 to 35 at. %, and from 0.1 to 10 at. %, respectively. Further, a silicon nitride oxide film means a film that contains nitrogen and oxygen so that the amount of nitrogen is larger than that of oxygen and contains oxygen, nitrogen, Si, and hydrogen at concentrations ranging from 5 to 30 at. %, from 20 to 55 at. %, from 25 to 35 at. %, and from 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Note that as the oxide semiconductor layer 103, a thin film represented by $InMO_3(ZnO)_m$ (m>0) is formed. In addition, a thin film transistor is manufactured using the thin film for a semiconductor layer. Note that M denotes one or more of metal elements selected from gallium (Ga), iron (Fe), nickel (Ni), manganese (Mn), and cobalt (Co). In addition to a case where only Ga is contained as M, there is a case where Ga and the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to a metal element contained as M. In this specification, this thin film is also referred to as an In—Ga—Zn—O-based non-single-crystal film.

An amorphous structure is observed in the crystal structure of the In—Ga—Zn—O-based non-single-crystal film by XRD (X-ray diffraction) even if heat treatment is performed on the In—Ga—Zn—O-based non-single-crystal film at 200° C. to 500° C., typically 300° C. to 400° C., for 10 to 100 minutes after sputtering is performed for deposition. In addition, a thin film transistor having electric characteristics such as an on/off ratio of $10^9$ or more and a mobility of 10 cm²/V·s or more at a gate voltage of ±20 V can be manufactured. A thin film transistor manufactured using an oxide semiconductor film having such electric characteristics has a higher mobility as compared to a thin film transistor manufactured using amorphous silicon, and a circuit including the thin film transistor cam be driven at high speed.

Note that the oxide semiconductor layer 103 is formed in such a manner that an oxide semiconductor layer is formed over the gate insulating film 102 by a sputtering method, a resist mask is formed over the oxide semiconductor layer by a photolithography process or an ink-jet method, and the oxide semiconductor layer is etched using the resist mask. A target whose ratio is set to $In_2O_3:Ga_2O_3:ZnO=1:1:1$ (In:Ga:Zn=1:1:0.5) is used to form an oxide semiconductor layer by a sputtering method. The oxide semiconductor layer 103 has a favorable light-transmitting property with respect to light used in light exposure of a photoresist in a later step, and thus the photoresist can be effectively exposed to light, as compared to amorphous silicon.

Examples of sputtering methods include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed. Here, a DC sputtering method is used for formation of the oxide semiconductor layer 103.

In addition, there is also a multi-source sputtering apparatus in which a plurality of targets of different materials can be set. With the multi-source sputtering apparatus, films of different materials can be deposited to be stacked in the same chamber, or plural kinds of materials can be deposited by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

In the sputtering chamber, any of various sputtering methods described above is used as appropriate.

In addition, as a film formation method, there are also a reactive sputtering method in which a target substance and a sputtering gas component chemically reacts with each other during film formation to form a thin film of a compound thereof, and a bias sputtering method in which voltage is also applied to a substrate during film formation.

Note that before the deposition of an oxide semiconductor by a sputtering method, dust attached to a surface of the gate insulating film 102 is preferably removed by reverse sputtering in which an argon gas is introduced to generate plasma. The reverse sputtering refers to a method in which, without application of a voltage to a target side, an RF power source is used for application of a voltage to a substrate side in an argon atmosphere to generate plasma on substrate to modify a surface. Note that instead of an argon atmosphere, nitrogen, helium, or the like may be used. Alternatively, an argon atmosphere to which oxygen, hydrogen, $N_2O$, or the like is added may be used. Still alternatively, an argon atmosphere to which $Cl_2$, $CF_4$, or the like is added may be used. By the reverse sputtering, an interface between the stacked films can be formed without being contaminated by an atmospheric component such as water vapor and impurity elements and dusts which float in the air. Thus, variations in thin film transistor characteristics can be reduced. The threshold voltage value of the thin film transistor is greatly affected by an interface of the oxide semiconductor, that is, an interface between the oxide semiconductor layer and the gate insulating film. Therefore, an interface between the gate insulating film 102 and the oxide semiconductor layer 103 is formed in a clean condition, whereby electric characteristics of the thin film transistor can be improved.

Next, heat treatment is performed at 200° C. to 600° C. in an air atmosphere or a nitrogen atmosphere. Heat treatment is preferably performed at 300° C. to 400° C., and here, the heat treatment is performed at 350° C. for an hour. Note that the timing of this heat treatment is not particularly limited and the heat treatment may be performed anytime as long as it is performed after the formation of the oxide semiconductor film. For example, the heat treatment may be performed after an insulating film to be a channel protective layer 110 is formed over the oxide semiconductor layer 103, after the channel protective layer 110 is patterned to be formed, after a conductive film to be a wiring layer 111 is formed, or after a sealing film of the thin film transistor is formed. Alternatively, heat cure treatment after formation of a planarization film may also serve as heat treatment.

Figure 1B:
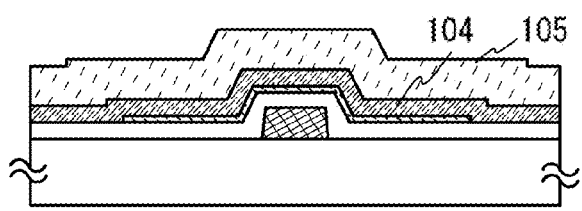

Next, an insulating layer 104 to be a channel protective layer is formed over the oxide semiconductor layer 103 and the gate insulating film 102. Then, a positive photoresist 105 (a photosensitive thin film) is formed over the insulating layer 104 (see FIG. 1B).

The insulating layer 104 functioning as a channel protective layer can be formed using an inorganic material (such as silicon oxide, silicon nitride, silicon oxynitride, or silicon nitride oxide). Alternatively, a film formed using one or a plurality of kinds of photosensitive or non-photosensitive organic materials (organic resin materials) (such as polyimide, acrylic, polyamide, polyimide amide, resist, and benzocyclobutene) or a stack of any of such films can be used. Alternatively, siloxane may be used. Note that as the insulating layer 104, an insulating film having a light-transmitting property with respect to light used in light exposure of a resist in a later step is used.

The insulating layer 104 can be formed by a vapor deposition method such as a plasma CVD method or a thermal CVD method, or a sputtering method. Alternatively, an application method such as a spin coating method which is a wet process can be used. Further alternatively, the insulating layer 104 may be formed by a droplet discharge method, a printing method (a method for forming a pattern, such as screen printing or offset printing), or the like.

A multi-chamber sputtering apparatus provided with a metal silicon target and a target for an oxide semiconductor film is used to form a silicon oxide film as the channel protective layer, without the oxide semiconductor film formed in the previous step being exposed to the air.

A portion of the positive photoresist 105 which is not irradiated with light, electrons, or an ion energy line remains as a resist pattern after development. As an example, a novolac resin and a naphthoquinone diazide compound that is a photosensitizer may be used. In using any of such materials, the surface tension and the viscosity can be appropriately controlled by adjusting the concentration of a solvent, adding a surfactant or the like, and/or the like.

Figure 1C:
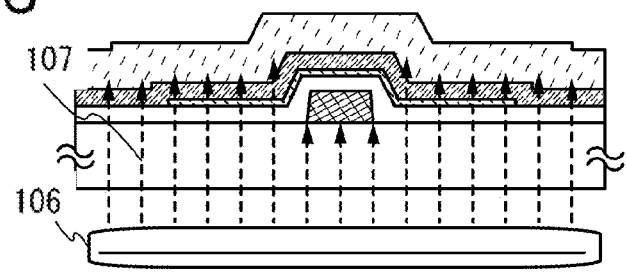

Next, the photoresist 105 which is formed over the insulating layer 104 is irradiated with light 107 from a light source 106 on the substrate 100 side (see FIG. 1C). Then, from the substrate 100 side, the photoresist 105 is irradiated with the light 107 which is transmitted through the substrate 100 from the light source 106, which is so-called back surface light exposure. The light 107 is transmitted through the substrate 100, the gate insulating film 102, the oxide semiconductor layer 103, and the insulating layer 104, whereas it is not transmitted through and is blocked by the gate electrode layer 101 having a light-blocking property. Therefore, in the photoresist 105, a region which overlaps with the gate electrode layer 101 is an unexposed region 108 and only an exposed region 109 is melted by development (see FIG. 1D).

In a structure described in Embodiment 1, since a back surface light exposure method is used for forming the unexposed region 108 and the exposed region 109 in the photoresist 105, the widths of the unexposed region 108 and the exposed region 109 can be determined depending on the light exposure time and development time, and the widths can be more precisely controlled as compared to alignment. Further, the number of photomasks can be reduced by one, so that reduction in cost and improvement in throughput can be achieved.

There are no particular limitations on the light 107 emitted from the light source 106, and it is possible to use any one of infrared light, visible light, and ultraviolet light or a combination of any of them. For example, light emitted from an ultraviolet lamp, a black light, a halogen lamp, a metal halide lamp, a xenon arc lamp, a carbon arc lamp, a high-pressure sodium lamp, or a high-pressure mercury lamp may be used. In this case, light from a lamp light source may be emitted for a required period or emitted several times.

In addition, a laser beam may also be used as the light 107. As a laser, a laser capable of emitting ultraviolet light, visible light, or infrared light can be used. As the laser, an excimer laser of KrF, ArF, XeCl, Xe, or the like; a gas laser of He, He—Cd, Ar, He—Ne, HF, or the like; a solid laser using a crystal of YAG, GdVO$_4$, YVO$_4$, YLF, YAlO$_3$, or the like doped with Cr, Nd, Er, Ho, Ce, Co, Ti or Tm; or a semiconductor laser of GaN, GaAs, GaAlAs, InGaAsP, or the like can be used. As for the solid laser, it is preferable to use first to fifth harmonics of a fundamental wave.

An optical system including a shutter, a reflector such as a mirror or a half mirror, a cylindrical lens, a convex lens, or the like may be provided to adjust the shape or path of light of a lamp light source or a laser beam emitted from the laser. In addition, one or more lamp light sources or laser oscillators may be provided, and an optical system including a light source and a substrate to be irradiated may be appropriately arranged in accordance with an object to be irradiated (material, thickness, or the like of the object). Note that in the case where the light 107 is obtained by a laser beam, a large-sized substrate can be processed by scanning the laser beam or scanning the substrate.

Note that in FIG. 1C, light emitted from a plurality of light sources is made almost perpendicular to the surface of the substrate 100.

Note that laser irradiation may be selectively performed by moving a substrate or may be performed by scanning the light in the X- and Y-axis directions. In such a case, a polygon mirror or a galvanometer mirror is preferably used for the optical system.

In addition, a combination of light emitted from a lamp light source and a laser beam may be used as the light 107. A region where light exposure is performed on the relatively wide range may be irradiated with light from a lamp, and only a region where highly precise light exposure is performed may be irradiated with a laser beam. By light irradiation performed in such a manner, throughput can be improved.

Figure 1D:
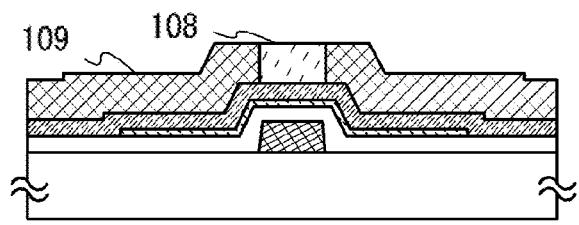
Figure 1E:
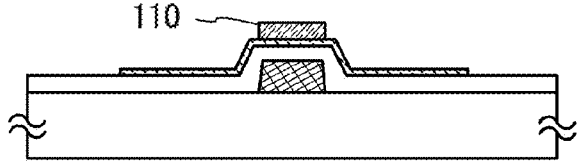

After the state in FIG. 1D, the insulating layer 104 is etched with the use of the unexposed region 108 of the developed photoresist 105 as a mask, whereby the channel protective layer 110 can be formed in a self-aligned manner (see FIG. 1E). Accordingly, a defective shape or the like due to misalignment of a photomask does not occur, and the channel protective layer 110 can be formed with high controllability. Therefore, a highly reliable semiconductor device can be manufactured with a high yield. Further, since the oxide semiconductor layer 103 has a light-transmitting property, a photoresist can be efficiently exposed to light, and the amount of photoresist used in the photolithography process can be reduced and time required for light exposure can be shortened. Accordingly, productivity of the semiconductor device can be improved. Further, in a structure of Embodiment 1, the channel protective layer 110 functions as an etching stopper which protects a portion to be a channel formation region in the oxide semiconductor layer 103. Therefore, damage (reduction in film thickness, oxidation, or the like by plasma or an etchant in etching) to the surface of the oxide semiconductor layer 103 by etching treatment in the patterning process of the conductive layer to be the wiring layer can be reduced. Accordingly, a semiconductor device having high electric characteristics can be manufactured.

Note that the channel protective layer 110 is formed using an insulating film containing oxygen such as silicon oxide, whereby the channel protective layer 110 can have an effect of blocking oxygen desorbed from the channel formation region of the oxide semiconductor layer 103, or the like. Therefore, the oxygen concentration of the oxide semiconductor layer can be maintained within an optimal range by heat treatment or the like after formation of the oxide semiconductor layer. Further, when the channel protective layer 110 and the gate insulating film 102 are formed using the same material, a surface of the gate insulating film 102 is etched by an etchant in processing of the channel protective layer 110.

Next, a conductive film is formed over the gate insulating film 102, the oxide semiconductor layer 103, and the channel protective layer 110, a resist mask is formed over the conductive film by a photolithography process or an ink-jet method using a third photomask, and the conductive film is etched using the resist mask. Then, the conductive film formed over the channel protective layer 110 is etched to be divided, so that wiring layers 111 to be source and drain electrodes are formed (see FIG. 1F). The wiring layers 111 formed using the conductive layers can be formed using the same material as the gate electrode layer 101. As a specific example of the conductive film, a single titanium film, a stack of a titanium film and an aluminum film, or a three-layer structure in which a titanium film, an aluminum film, and a titanium film are stacked in this order can be given.

A thin film transistor in which the In—Ga—Zn—O-based non-single-crystal film is used for the oxide semiconductor layer 103 in Embodiment 1 has a favorable light-transmitting property, so that in back surface light exposure, a photoresist can be efficiently exposed to light, the amount of the photoresist can be reduced, and time required for light exposure can be shortened, leading to improvement in productivity. Further, a transistor is manufactured using the oxide semiconductor layer, whereby electric characteristics and reliability of the transistor can be improved.

Figure 1F:
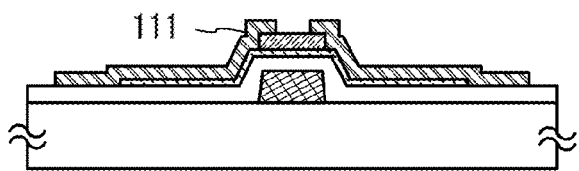
Figure 2:
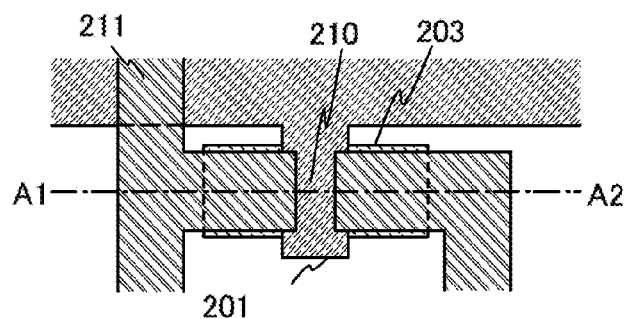
FIG. 2 is a diagram illustrating Embodiment 1.

FIG. 2 illustrates one example of a top view of the thin film transistor corresponding to the cross-sectional view illustrated in FIG. 1F. A cross-sectional view taken along dashed line A1-A2 in the top view in FIG. 2 corresponds to FIG. 1F. Similarly to the cross-sectional view in FIG. 1F, in the top view in FIG. 2, a layer 201 to be the gate electrode layer 101, the gate insulating film (not illustrated), an oxide semiconductor layer 203, a channel protective layer 210, and a layer 211 to be the wiring layer 111 are stacked in this order, and shapes of the layers are illustrated. Note that the layer 201 to be the gate electrode layer 101 is provided so as to be overlapped with the channel protective layer 210. In the top view of the thin film transistor illustrated in FIG. 2, the shapes of the layer 201 to be the gate electrode layer 101, the oxide semiconductor layer 203, the channel protective layer 210, and the layer 211 to be the wiring layer 111 are not limited to the structure illustrated in FIG. 2. An example in which a channel region between a source region and a drain region facing each other has a parallel shape when seen from above. A thin film transistor may have a channel formation region whose top surface shape is a C (U) shape.

Figure 3A:
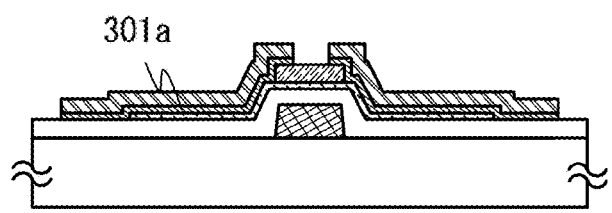
FIGS. 3A and 3B are diagrams illustrating Embodiment 1.
Figure 3B:
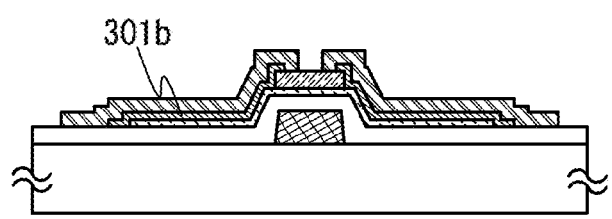

Note that in the cross-sectional view of the thin film transistor illustrated in FIG. 1F, an In—Ga—Zn—O-based non-single-crystal film which has a composition ratio different from that of the oxide semiconductor layer 103 is provided between the oxide semiconductor layer 103 and the wiring layer 111. A buffer layer having a higher carrier concentration than the oxide semiconductor layer 103 is intentionally provided, so that an ohmic contact may be formed. FIGS. 3A and 3B are examples of cross-sectional views.

In the cross-sectional view in FIG. 3A, as an example, a structure in which after the channel protective layer 110 is patterned, a buffer layer 301a and a conductive layer to be a wiring layer are formed, and patterning is performed is illustrated. In FIG. 3B, as an example, a structure in which the channel protective layer 110 is patterned, a layer to be a buffer layer is formed, and a patterning is performed to form a buffer layer 301b is illustrated. In the structure in Embodiment 1, the channel protective layer 110 functions as an etching stopper which protects a portion to be a channel formation region in the oxide semiconductor layer 103. Therefore, damage (reduction in film thickness, oxidation, or the like by plasma or an etchant in etching) to the surface of the oxide semiconductor layer in etching treatment in a patterning process of the conductive layer to be a wiring layer and the layer to be a buffer layer can be reduced.

Note that the buffer layer 301a and the buffer layer 301b may be formed using an oxide semiconductor including In, Ga, or Zn having n-type conductivity, or an oxide semiconductor layer to which an impurity element imparting n-type conductivity is added. As the impurity element, for example, magnesium, aluminum, titanium, scandium, yttrium, zirconium, hafnium, boron, thallium, germanium, tin, lead, or the like can be used.

The buffer layer 301a and the buffer layer 301b function as an n$^+$ layer and can also be referred to as a source or drain region.

As described above, the structure of Embodiment 1 is applied, whereby in manufacturing a thin film transistor having favorable electric characteristics, manufacturing cost can be reduced, productivity can be improved, and at the same time, reliability can be improved. Thus, a semiconductor device including a thin film transistor having high electric characteristics and high reliability can be provided.

Note that the order of the steps described above is merely an example and there is no limitation to this order. For example, although the number of photomasks increases by one, a photomask for etching the second conductive film and a photomask for etching part of the n$^+$ layer and part of the oxide semiconductor film may be separately used.

Note that in Embodiment 1, what are illustrated in drawings can be freely combined with or replaced with what are described in other embodiments as appropriate.

(Embodiment 2)

In Embodiment 2, a method for manufacturing a thin film transistor formed using an oxide semiconductor different from that in Embodiment 1 is described with reference to cross-sectional views.

Figure 21A:
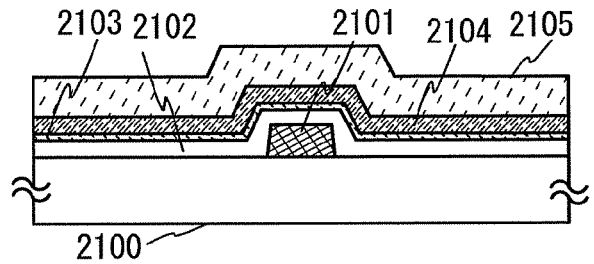
FIGS. 21A to 21F are diagrams illustrating Embodiment 2.

First, over a substrate 2100 having a light-transmitting property, a first conductive layer is formed using a light-blocking material and patterning is performed using a first photomask, so that a gate electrode 2101 is formed. A gate insulating film 2102 having a light-transmitting property is formed over the gate electrode 2101. An oxide semiconductor layer 2103 is formed over the gate insulating film 2102, and then an insulating layer 2104 to be a protective layer is formed over the oxide semiconductor layer successively (also referred to as successive film formation). A positive photoresist 2105 is formed over the insulating layer 2104 to be a protective layer (see FIG. 21A).

Note that description of the substrate 2100, the gate electrode 2101, the gate insulating film 2102, the oxide semiconductor layer 2103, the insulating layer 2104 to be a protective layer, and the positive photoresist 2105 is the same as that of the substrate 100, the gate electrode layer 101, the gate insulating film 102, the oxide semiconductor layer 103, the insulating layer 104 to be a protective layer, and the positive photoresist 105 described in Embodiment 1.

Note that the method, which is described in Embodiment 2, for manufacturing a semiconductor device is different from that in Embodiment 1 in that the oxide semiconductor layer 2103 and the insulating layer 2104 to be a protective layer are formed successively. By successive film formation of the oxide semiconductor layer 2103 and the insulating layer 2104 to be a protective layer, an interface between the oxide semiconductor layer 2103 and the insulating layer 2104 to be a protective layer can be formed without being contaminated by an atmospheric component such as water vapor and impurity elements and dusts which float in the air. Thus, variation in characteristics of the semiconductor device can be reduced.

Note that successive film formation in Embodiment 2 means that during a series of steps from a step of forming the oxide semiconductor layer 2103 to a step of processing the insulating layer 2104 to be a protective layer, a substrate to be processed is placed in an atmosphere which is controlled to be vacuum or an inert gas atmosphere (a nitrogen atmosphere or a rare gas atmosphere) at all time without being exposed to a contaminated atmosphere such as the air. By the successive film formation, films can be formed while moisture or the like is prevented from attaching again to the substrate to be processed which is cleaned. In addition, the successive film formation includes plasma treatment such as reverse sputtering. Note that the insulating layer 2104 to be a protective layer may be formed in the same chamber as the chamber where the oxide semiconductor layer 2103 is formed or in a different chamber as long as the film formation can be performed without exposure to the air.

Figure 21B:
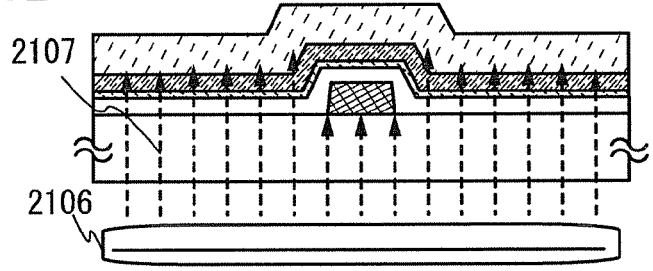

Next, the photoresist 2105 is irradiated with light 2107 from a light source 2106 on the substrate 2100 side (see FIG. 21B). Then, back surface light exposure is performed on the photoresist 2105 from the substrate 2100 side. In the photoresist 2105, a region overlapping the gate electrode 2101 becomes an unexposed region 2108 and only an exposed region 2109 is melted by development (see FIG. 21C).

In a structure similar to Embodiment 1, which is described in Embodiment 2, since a back surface light exposure method is used for forming the unexposed region 2108 and the exposed region 2109 of the photoresist 2105, the widths of the unexposed region 2108 and the exposed region 2109 can be determined depending on the light exposure time and the development time, and the widths can be more precisely controlled as compared to alignment. Further, the number of photomasks can be reduced by one, so that reduction in cost and improvement in throughput can be achieved.

Note that description of the light source 2106, the light 2107, the unexposed region 2108, and the exposed region 2109 is similar to that of the light source 106, the light 107, the unexposed region 108, and the exposed region 109 in Embodiment 1.

Figure 21C:
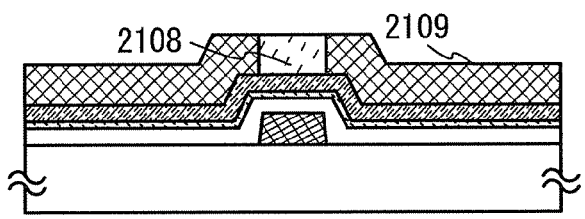
Figure 21D:
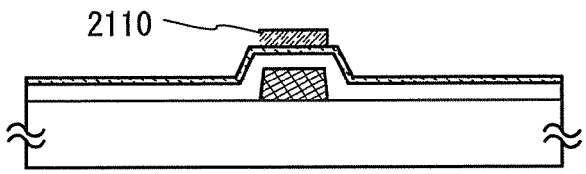

After the state in FIG. 21C, the insulating layer 2104 to be a protective layer is etched with the use of the unexposed region 2108 of the developed photoresist 2105 as a mask, whereby a channel protective layer 2110 can be formed in a self-aligned manner (see FIG. 21D). Accordingly, a defective shape or the like due to misalignment of a photomask does not occur, and the channel protective layer 2110 can be formed with high controllability. Therefore, a highly reliable semiconductor device can be manufactured with a high yield. Further, since the oxide semiconductor layer 2103 has a light-transmitting property, a photoresist can be efficiently exposed to light, the amount of photoresist used in the photolithography process can be reduced, and time required for light exposure can be shortened. Accordingly, productivity of the semiconductor device can be improved. Further, in a structure of Embodiment 2, the channel protective layer 2110 functions as an etching stopper which protects a portion to be a channel formation region in the oxide semiconductor layer 2103. Therefore, damage to the surface of the oxide semiconductor layer 2103 by etching treatment in the patterning process of the conductive layer to be a wiring layer can be reduced. Accordingly, a semiconductor device having high electric characteristics can be manufactured.

Note that description of the channel protective layer 2110 is similar to that of the channel protective layer 110 in Embodiment 1.

Figure 21E:
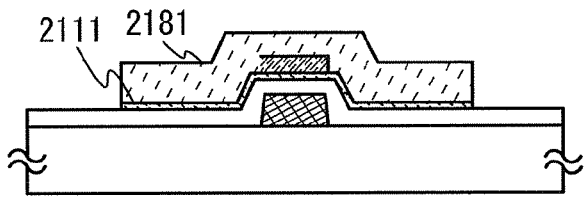

Next, a resist mask is formed over the oxide semiconductor layer 2103 and the channel protective layer 2110 by a photolithography process or an ink-jet method using a second photomask, and the oxide semiconductor layer 2103 is patterned. Then, an unnecessary portion of the oxide semiconductor layer 2103 is removed, so that an island-shaped oxide semiconductor layer 2111 is formed (see FIG. 21E). Note that the island-shaped oxide semiconductor layer 2111 is formed using a resist mask 2181 formed using the second photomask. This is different from the process of the oxide semiconductor layer in Embodiment 1 in that the channel protective layer 2110 is provided, whereby damage to a region in which the island-shaped oxide semiconductor layer 2111 and the channel protective layer 2110 are in contact with each other by etching treatment in the patterning process can be reduced.

Figure 21F:
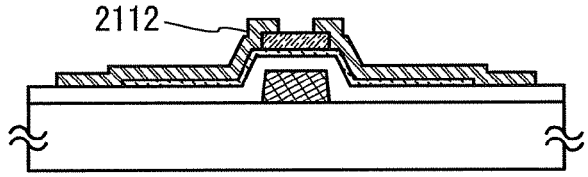

Next, a conductive film is formed over the gate insulating film 2102, the oxide semiconductor layer 2111, and the channel protective layer 2110, a resist mask is formed over the conductive film by a photolithography process or an ink-jet method using a third photomask, and the conductive film is patterned. Then, the conductive film formed over the channel protective layer 2110 is etched to be divided, so that wiring layers 2112 to be source and drain electrodes are formed (see FIG. 21F). The wiring layers 2112 formed using the conductive layers can be formed using the same material as the gate electrode 2101. As a specific example of the conductive film, a single titanium film, a stack of a titanium film and an aluminum film, or a three-layer structure in which a titanium film, an aluminum film, and a titanium film are stacked in this order can be given.

A thin film transistor in which the In—Ga—Zn—O-based non-single-crystal film is used for the oxide semiconductor layer 2103 in Embodiment 2 has a favorable light-transmitting property, so that in back surface light exposure, a photoresist can be efficiently exposed to light, the amount of the photoresist can be reduced, and time required for light exposure can be shortened, leading to improvement in productivity. Further, a transistor is manufactured using the oxide semiconductor layer, whereby electric characteristics and reliability of the transistor can be improved.

As described above, the structure of Embodiment 2 is applied, whereby in manufacturing a thin film transistor having favorable electric characteristics, manufacturing cost can be reduced, productivity can be improved, and at the same time, reliability can be improved. Thus, a semiconductor device including a thin film transistor having high electric characteristics and high reliability can be provided.

Note that the order of the steps described above is merely an example, and similarly to Embodiment 1, there is no particular limitation to this order. For example, an n$^+$ layer may be provided between the oxide semiconductor layer 2111 and the wiring layers 2112; in addition, part of the n$^+$ layer may be etched.

Note that in Embodiment 2, what are illustrated in drawings can be freely combined with or replaced with what are described in other embodiments as appropriate.

(Embodiment 3)

In Embodiment 3, a manufacturing process in the case where the semiconductor device described in Embodiment 1 is applied to each pixel of an active matrix display device is described with reference to FIGS. 4A to 4C, FIGS. 5A to 5C, FIG. 6, FIG. 7, FIG. 8, FIG. 9, FIGS. 10A, 10B, 10C, and 10D, and FIG. 11.

Note that one pixel corresponds to one component whose brightness can be controlled. Therefore, for example, one pixel corresponds to one color element and brightness is expressed with the one color element. Accordingly, in the case of a color display device having color elements of R, G, and B, a minimum unit of an image is formed of three pixels of an R pixel, a G pixel, and a B pixel.

Note that the display device means a device including a display element such as a light-emitting element or a liquid crystal element. In addition, a display device may include a peripheral driver circuit for driving a plurality of pixels. The peripheral driver circuit for driving a plurality of pixels is formed over the same substrate as the plurality of pixels. A display device may include a flexible printed circuit (FPC). Note that a display device may include a printed wiring board (PWB) which is connected through a flexible printed circuit (FPC) or the like and to which an IC chip, a resistor, a capacitor, an inductor, a transistor, or the like is attached. The display device may also include an optical sheet such as a polarizing plate or a retardation plate. The display device may also include a lighting device, a chassis, an audio input and output device, a light sensor, or the like.

In FIG. 4A, as a light-transmitting substrate 400, for example, it is possible to use a glass substrate formed of barium borosilicate glass, aluminoborosilicate glass, or the like typified by #7059 glass, #1737 glass, or the like manufactured by Corning Incorporated.

Figure 6:
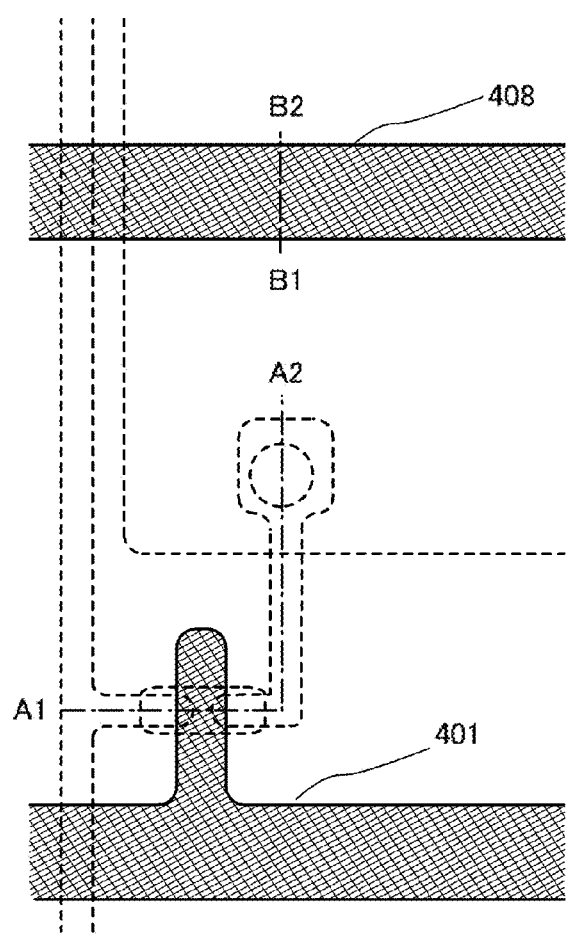
FIG. 6 is a diagram illustrating Embodiment 3.
Figure 7:
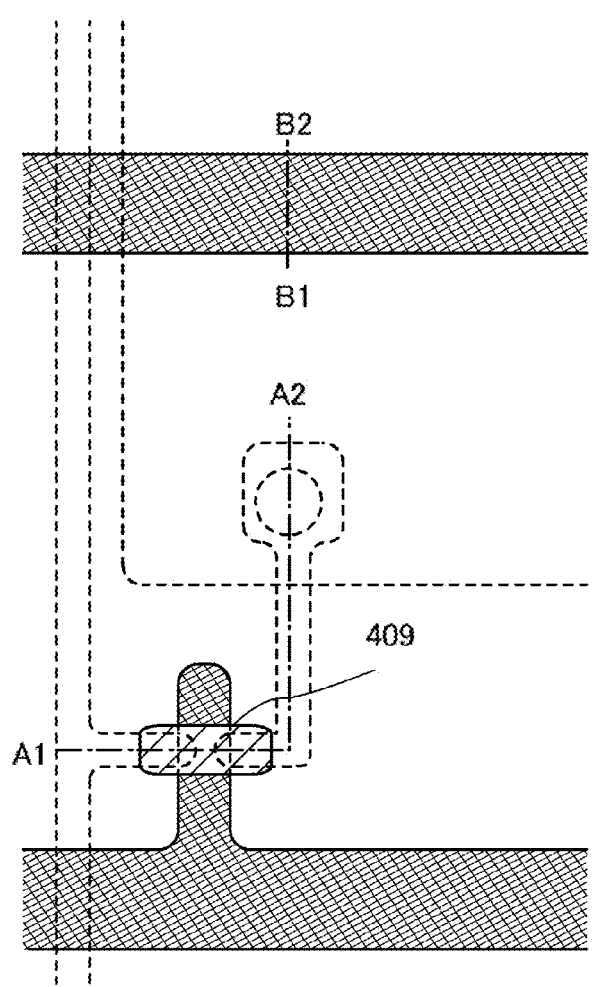
FIG. 7 is a diagram illustrating Embodiment 3.
Figure 8:
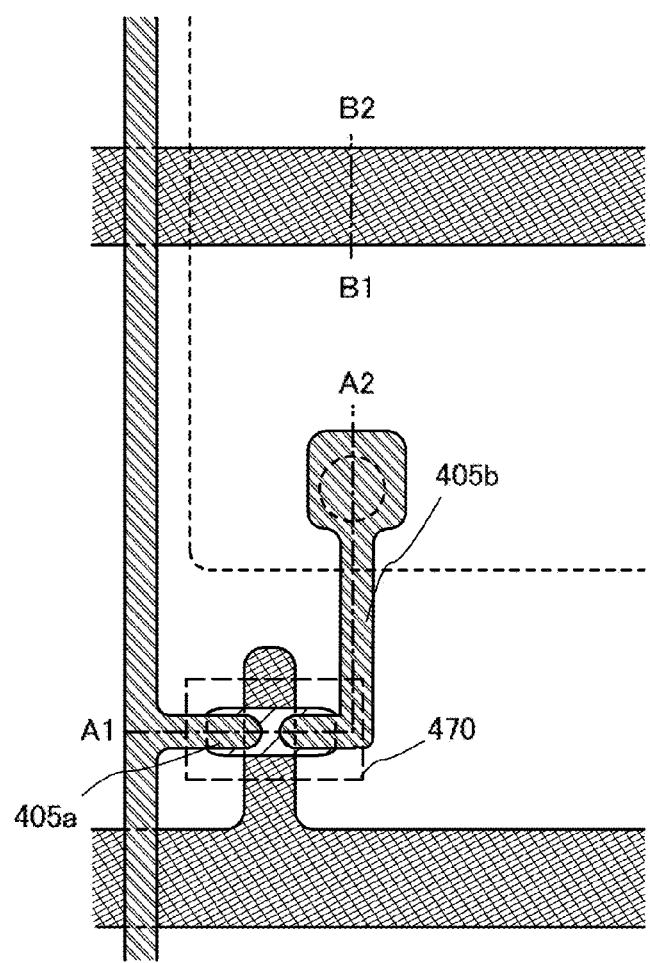
FIG. 8 is a diagram illustrating Embodiment 3.

After a conductive layer is formed over the entire surface of the substrate 400, patterning is performed using a first photomask, and unnecessary portions are removed so as to form wirings and an electrode (a gate wiring including a gate electrode layer 401, a capacitor wiring 408, and a first terminal 421). At this time, the etching is performed so that at least end portions of the gate electrode layer 401 have a tapered shape. FIG. 4A illustrates a cross-sectional view at this stage. Note that FIG. 6 is a top view at this stage.

The gate wiring including the gate electrode layer 401, the capacitor wiring 408, and the first terminal 421 in the terminal portion are formed using a light-blocking material. As an example, a low-resistance conductive material such as aluminum (Al) or copper (Cu) is desirably used; however, since aluminum alone has disadvantages such as low heat resistance and a tendency to be corroded, it is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy film containing a combination of any of these elements, or a nitride containing any of these elements as its component.

Next, a gate insulating film 402 is formed to cover an entire surface of the gate wiring including gate electrode layer 401, the capacitor wiring 408, and the first terminal 421. As the gate insulating film 402, an insulating film having a light-transmitting property is used. The gate insulating film 402 is formed to a thickness of 50 to 250 nm by a sputtering method or the like.

For example, as the gate insulating film 402, a silicon oxide film is formed to a thickness of 100 nm by a sputtering method. Needless to say, the gate insulating film 402 is not limited to such a silicon oxide film and may be a single layer or a stacked layer including another insulating film such as a silicon oxynitride film, a silicon nitride film, an aluminum oxide film, or a tantalum oxide film.

Note that before the deposition of the oxide semiconductor film, dust attached to a surface of the gate insulating film is preferably removed by reverse sputtering in which an argon gas is introduced to generate plasma. Note that instead of an argon atmosphere, nitrogen, helium, or the like may be used. Alternatively, an argon atmosphere to which oxygen, hydrogen, $N_2O$, or the like is added may be used. Further alternatively, an argon atmosphere to which $Cl_2$, $CF_4$, or the like is added may be used.

Next, an oxide semiconductor layer (an In—Ga—Zn—O-based non-single-crystal film) is formed over the gate insulating film 402. Formation of the oxide semiconductor layer without exposure to air after the plasma treatment is effective in preventing dust and moisture from attaching to the interface between the gate insulating film and the oxide semiconductor layer. Here, the oxide semiconductor layer is formed in an argon or oxygen atmosphere using an oxide semiconductor target having a diameter of 8 inches and containing In, Ga, and Zn ($In_2O_3:Ga_2O_3:ZnO=1:1:1$), with the distance between the substrate and the target of 170 mm, under a pressure of 0.4 Pa, and with a direct-current (DC) power source of 0.5 kW. Note that it is preferable to use a pulsed direct-current (DC) power source with which dust can be reduced and thickness distribution can be uniform. The thickness of the oxide semiconductor layer is set to 5 nm to 200 nm. In Embodiment 3, the thickness of the oxide semiconductor layer is 100 nm. Note that the oxide semiconductor layer has a favorable light-transmitting property with respect to light used in light exposure to a photoresist in a later step, so that the photo resist can be effectively exposed to light as compared to the case of using amorphous silicon.

Next, patterning is performed using a second photomask, and unnecessary portions are removed so as to form an island-shaped oxide semiconductor layer 409. Here, wet etching is performed using ITO-07N (product of KANTO CHEMICAL CO., INC.); thus, the oxide semiconductor layer is patterned. Note that etching here is not limited to wet etching and may be dry etching.

Next, an insulating layer to be a protective layer is formed over the oxide semiconductor layer 409 and the gate insulating film 402. Then, as described in Embodiment 1, a positive photoresist is formed over the insulating layer, patterning is performed by using a back surface light exposure method so that unnecessary portions are removed so as to form channel protective layers 411 patterned the same as the gate electrode layer.

Here, as the insulating film forming the channel protective layers 411, a silicon oxide film is used. Alternatively, for the channel protective layers 411, an aluminum oxide film ($Al_2O_3$ film), a magnesium oxide film ($MgO_x$ film), an aluminum nitride film ($AlN_x$ film), an yttrium oxide film ($YO_x$ film), or the like may be used instead of the silicon oxide film.

A small amount of a halogen element such as fluorine or chlorine may be added to the channel protective layers 411 so that movable ions such as sodium ions can be immobilized. As the method, film formation is performed by sputtering in which a gas containing a halogen element is introduced into a chamber. In the case where a gas containing a halogen element is introduced, an exhaust means of the chamber needs to be provided with an abatement system. The peak of the concentration of a halogen element to be contained in the channel protective layers 411 is measured by a secondary ion mass spectrometer (SIMS) and is preferably in the range of from $1 \times 10^{15}$ $cm^{-3}$ to $1 \times 10^{20}$ $cm^{-3}$.

When a silicon oxide film is used for the channel protective layer 411, a sputtering method in which artificial quartz is used as a target and a rare gas, typically argon, is used, or a reactive sputtering method in which single crystal silicon is used as a target and chemically reacted with an oxygen gas to obtain a silicon oxide film can be used. Here, as an example, artificial quartz is used as a target, and sputtering is performed in an atmosphere containing only oxygen or an atmosphere containing oxygen at 90% or higher and Ar at 10% or lower so that as much oxygen as possible is contained in a silicon oxide film. Thus, the silicon oxide film containing excessive oxygen is formed.

A cross-sectional view at this stage is illustrated in FIG. 4B. Note that a top view at this stage corresponds to FIG. 7. The channel protective layers 411 are superposed over the gate wiring including the gate electrode layer 401, the capacitor wiring 408, and the first terminal 421 and are not particularly illustrated in FIG. 7.

Next, patterning is performed using a third photomask and unnecessary portions are removed by etching, whereby a contact hole is formed which reaches the wirings and the electrode layer, which are formed using the same material as the gate electrode layer. This contact hole is provided for direct contact with the conductive film formed later. For example, in a driving circuit portion, a contact hole is formed when a thin film transistor whose gate electrode is in direct contact with the source or drain electrode layer is formed or when a terminal that is electrically connected to a gate wiring of a terminal portion is formed.

Next, a conductive film 432 is formed using a metal material over the oxide semiconductor layer 409 by a sputtering method or a vacuum evaporation method. A cross-sectional view at this stage is illustrated in FIG. 4C.

As a material of the conductive film 432, the same material as the gate electrode layer 401 can be used. Here, the conductive film 432 has a single-layer structure of a titanium film. Alternatively, the conductive film 432 may have a two-layer structure in which a titanium film is stacked over an aluminum film. Still alternatively, the conductive film 432 may have a three-layer structure in which a Ti film, an aluminum film containing Nd (Al—Nd), and a Ti film are stacked in this order. Further alternatively, the conductive film 432 may have a single-layer structure of an aluminum film containing silicon.

When heat treatment is performed on the oxide semiconductor layer 409 at 200° C. to 600° C., the conductive film 432 preferably has heat resistance so as to withstand this heat treatment. Since aluminum alone has disadvantages such as low heat resistance and a tendency to be corroded, it is used in combination with a conductive material having heat resistance. As the conductive material having heat resistance which is used in combination with Al, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy film containing a combination of any of these elements, or a nitride containing any of these elements as its component.

Next, patterning is performed using a fourth photomask and unnecessary portions are removed by etching, so that a source electrode layer 405a, a drain electrode layer 405b, and a connection electrode 420 are formed. Wet etching or dry etching is used as an etching method at this time. For example, when an aluminum film or an aluminum-alloy film is used as the conductive film 432, wet etching can be carried out using a mixed solution of phosphoric acid, acetic acid, and nitric acid. Here, wet etching is conducted using an ammonia hydrogen peroxide mixture (hydrogen peroxide:ammonia:water=5:2:2), whereby the conductive film 432 of the Ti film is etched to form the source electrode layer 405a and the drain electrode layer 405b. In this etching process, the channel protective layer 411 over the oxide semiconductor layer 409 functions as an etching stopper, so that damage (reduction in film thickness, oxidation, or the like by plasma or an etchant in etching) to the surface of the oxide semiconductor layer 409 by etching treatment in the patterning process using the fourth photomask can be reduced. In FIG. 5A, wet etching allows the layers to be etched isotropically, so that edges of the source electrode layer 405a and the drain electrode layer 405b and the connection electrode 420 are receded from a resist mask 431. Through the above process, a thin film transistor 470 in which the oxide semiconductor layer 409 serves as a channel formation region can be manufactured. A cross-sectional view at this stage is illustrated in FIG. 5A. A top view at this stage corresponds to FIG. 8.

Next, heat treatment is preferably performed at 200° C. to 600° C., typically, 300° C. to 500° C. Here, heat treatment is performed in a nitrogen atmosphere in a furnace at 350° C. for 1 hour. Through this heat treatment, rearrangement at the atomic level occurs in the oxide semiconductor layer 409, which is the In—Ga—Zn—O-based non-single-crystal film. Because strain which inhibits carrier movement is released, the heat treatment (including optical annealing) is important. Note that there is no particular limitation on when to perform the heat treatment as long as it is performed after the formation of the oxide semiconductor layer 409; for example, it may be performed after the formation of a pixel electrode.

In the patterning using the fourth photomask, a second terminal 422 which is formed using the same material as the source electrode layer 405a and the drain electrode layer 405b is left in the terminal portion. Note that the second terminal 422 is electrically connected to a source wiring (a source wiring including the source electrode layer 405a and the drain electrode layer 405b).

In addition, in the terminal portion, the connection electrode 420 is directly connected to the first terminal 421 of the terminal portion through the contact hole formed in the gate insulating film. Note that although not illustrated here, a source or drain wiring of the thin film transistor of the driver circuit is directly connected to the gate electrode through the same process as the above-described process.

Next, the resist mask 431 is removed, and a protective insulating layer 407 is formed to cover the thin film transistor 470. As the protective insulating layer 407, a silicon nitride film, a silicon oxide film, a silicon oxynitride film, an aluminum oxide film, a tantalum oxide film, or the like which is obtained by a sputtering method or the like can be used.

Next, patterning is performed using a fifth photomask, a resist mask is formed, and a contact hole 425 which reaches the drain electrode layer 405b is formed by etching the protective insulating layer 407. In addition, by the etching here, a contact hole 427 which reaches the second terminal 422 and a contact hole 426 which reaches the connection electrode 420 are also formed. A cross-sectional view at this stage is illustrated in FIG. 5B.

Then, after the resist mask is removed, a transparent conductive film is formed. The transparent conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Etching treatment of such a material is performed using a hydrochloric acid based solution. Instead, because a residue tends to be generated particularly in etching ITO, an alloy of indium oxide and zinc oxide ($In_2O_3$—ZnO) may be used in order to improve etching processability.

Next, patterning is performed using a sixth photomask and unnecessary portions are removed by etching so as to form a pixel electrode layer 410.

Further, in this patterning using the sixth photomask, a storage capacitor is formed using the capacitor wiring 408 and the pixel electrode layer 410 with the use of the gate insulating film 402, the insulating layer 475 formed in the same layer as the channel protective layer 411, and the protective insulating layer 407 in the capacitor portion as dielectrics.

In addition, in this patterning using the sixth photomask, the first terminal and the second terminal are covered with the resist mask, so that transparent conductive films 428 and 429 are left in the terminal portions. The transparent conductive films 428 and 429 function as electrodes or wirings connected to an FPC. The transparent conductive film 428 formed over the connection electrode 420 which is directly connected to the first terminal 421 becomes a connection terminal electrode which functions as an input terminal of the gate wiring. The transparent conductive film 429 formed over the second terminal 422 is a connection terminal electrode which functions as an input terminal of the source wiring.

Figure 9:
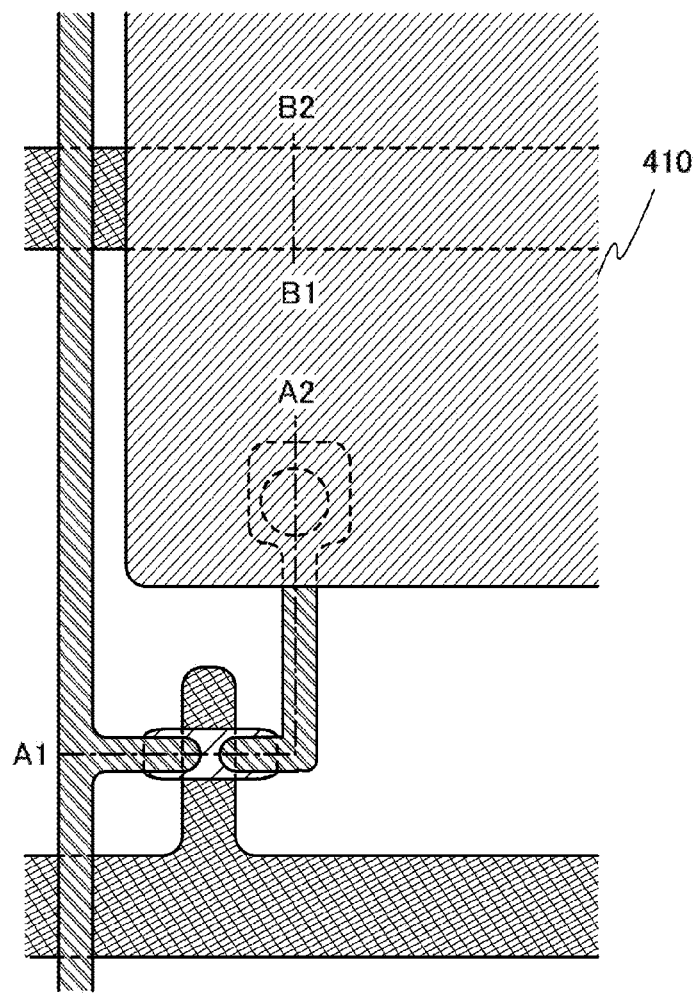
FIG. 9 is a diagram illustrating Embodiment 3.

Then, the resist mask is removed. A cross-sectional view at this stage is illustrated in FIG. 5C. Note that FIG. 9 is a top view at this stage.

Figure 10A:
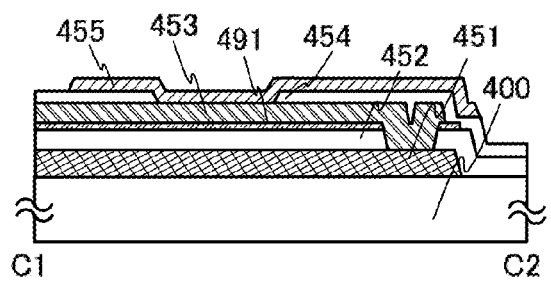
FIGS. 10A, 10B, 10C, and 10D are diagrams illustrating Embodiment 3.
Figure 10B:
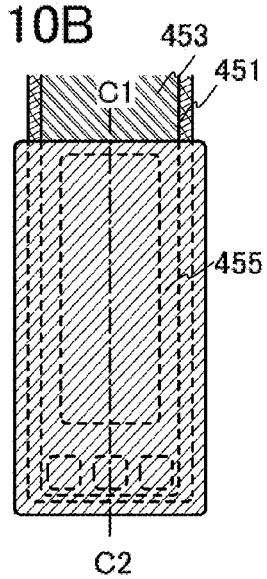

FIGS. 10A and 10B are respectively a cross-sectional view and a top view of a gate wiring terminal portion at this stage. FIG. 10A is a cross-sectional view taken along line C1-C2 of FIG. 10B. In FIG. 10A, a transparent conductive film 455 formed over a protective insulating film 454 is a connection terminal electrode which functions as an input terminal. Furthermore, in FIG. 10A, in the terminal portion, a first terminal 451 formed using the same material as the gate wiring and a connection electrode 453 formed using the same material as the source wiring are overlapped with each other with a gate insulating film 452 and an insulating film 491 interposed therebetween, and the first terminal 451 and the connection electrode 453 are in direct contact with each other through a contact hole to form conduction therebetween. In addition, the connection electrode 453 and the transparent conductive film 455 are in direct contact with each other through a contact hole provided in the protective insulating film 454 to form conduction therebetween. Note that the insulating film 491 is formed to be overlapped with the first terminal 451 because of back surface light exposure from the gate electrode layer side in formation of the channel protective layer.

Figure 10C:
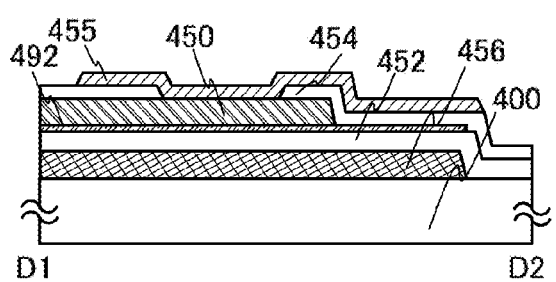
Figure 10D:
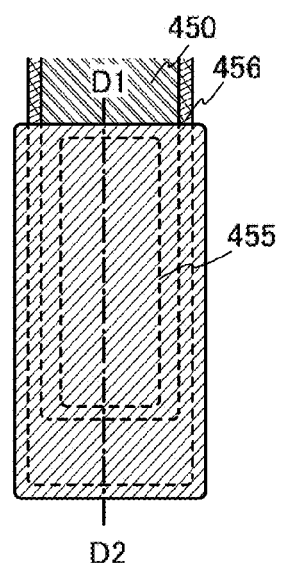

Further, FIGS. 10C and 10D are respectively a cross-sectional view and a top view of a source wiring terminal portion. FIG. 10C is a cross-sectional view taken along line D1-D2 of FIG. 10D. In FIG. 10C, a transparent conductive film 455 formed over a protective insulating film 454 is a connection terminal electrode which functions as an input terminal. Furthermore, in FIG. 10C, in the terminal portion, an electrode 456 formed using the same material as the gate wiring is located below and overlapped with a second terminal 450 which is electrically connected to the source wiring with a gate insulating layer 452 and an insulating film 492 interposed therebetween. The electrode 456 is not electrically connected to the second terminal 450, and a capacitor to prevent noise or static electricity can be formed if the potential of the electrode 456 is set to a potential different from that of the second terminal 450, such as floating, GND, or 0 V. In addition, the second terminal 450 is electrically connected to the transparent conductive film 455 with the protective insulating film 454 interposed therebetween. Note that the insulating film 492 is formed to be overlapped with the electrode 456 because of back surface light exposure from the gate electrode layer side in formation of the channel protective layer.

A plurality of gate wirings, source wirings, and capacitor wirings is provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals may be determined by a practitioner as appropriate.

Through the six patterning using photomasks, a pixel thin film transistor portion including the thin film transistor 470 which is a bottom-gate n-channel thin film transistor, and the storage capacitor can be completed. When the pixel thin film transistor portion and the storage capacitor are arranged in a matrix corresponding to respective pixels, a pixel portion can be formed and one of the substrates for manufacturing an active matrix display device can be obtained. In this specification, such a substrate is referred to as an active matrix substrate for convenience.

When an active matrix liquid crystal display device is manufactured, an active matrix substrate and a counter substrate provided with a counter electrode are bonded to each other with a liquid crystal layer interposed therebetween. Note that a common electrode which is electrically connected to the counter electrode provided over the counter substrate is provided over the active matrix substrate, and a fourth terminal electrically connected to the common electrode is provided in the terminal portion. This fourth terminal is provided so that the common electrode is set to a fixed potential such as GND or 0 V.

Figure 11:
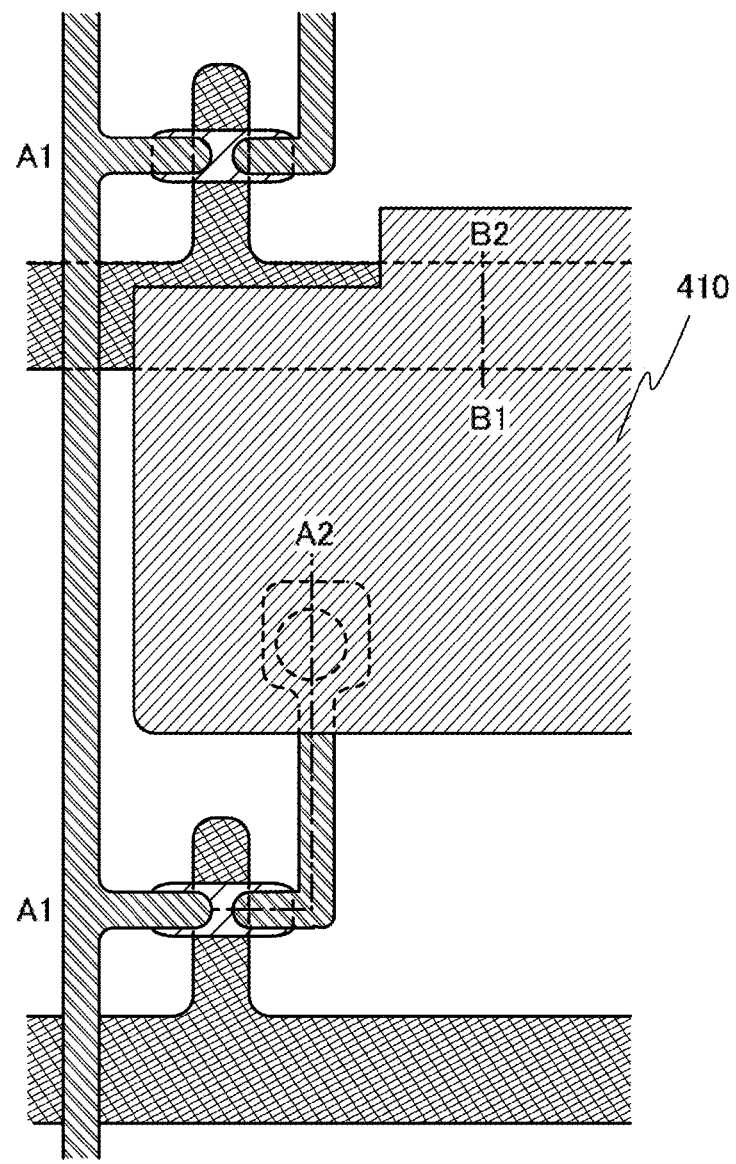
FIG. 11 is a diagram illustrating Embodiment 3.

A pixel structure is not limited to that in FIG. 9, and an example of the top view different from FIG. 9 is illustrated in FIG. 11. FIG. 11 illustrates an example in which a capacitor wiring is not provided and a storage capacitor is formed with a pixel electrode and a gate wiring of an adjacent pixel which are overlapped with each other with a protective insulating film and a gate insulating film interposed therebetween. In this case, the capacitor wiring and the third terminal connected to the capacitor wiring can be omitted. Note that the top view illustrated in FIG. 11 has the same shape as the top view illustrated in FIG. 9 and the cross-sectional views illustrated in FIGS. 4A to 4C and FIGS. 5A to 5C; therefore description is omitted.

In an active matrix liquid crystal display device, display patterns are formed on a screen by driving pixel electrodes arranged in a matrix. In more detail, when voltage is applied between a selected pixel electrode and a counter electrode that corresponds to the selected pixel electrode, a liquid crystal layer provided between the pixel electrode and the counter electrode is optically modulated, and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method so-called double-frame rate driving may be employed in which a vertical synchronizing frequency is 1.5 times or more, preferably 2 times or more as high as a usual vertical synchronizing frequency, whereby the moving-image characteristics are improved.

Further alternatively, in order to improve the moving-image characteristics of a liquid crystal display device, a driving method may be employed in which a plurality of LED (light-emitting diode) light sources or a plurality of EL light sources are used to form a surface light source as a backlight, and each light source of the surface light source is independently driven in a pulsed manner in one frame period. As the surface light source, three or more kinds of LEDs may be used or an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By a combination of these driving methods, the display characteristics of a liquid crystal display device, such as moving-image characteristics, can be improved as compared to those of conventional liquid crystal display devices.

The n-channel transistor obtained in Embodiment 3 includes the In—Ga—Zn—O-based non-single-crystal film in the channel formation region and has favorable dynamic characteristics. Thus, these driving methods can be applied in combination.

When a light-emitting display device is manufactured, one electrode (also referred to as a cathode) of an organic light-emitting element is set to a low power supply potential such as GND or 0 V; therefore, a terminal portion is provided with a fourth terminal for setting the cathode to a low power supply potential such as GND or 0 V. In addition, when a light-emitting display device is manufactured, a power supply line is provided in addition to a source wiring and a gate wiring. Therefore, a terminal portion is provided with a fifth terminal electrically connected to the power supply line.

With the use of the thin film transistor in which an oxide semiconductor is used in a gate line driver circuit or a source line driver circuit, whereby manufacturing cost is reduced. Moreover, a gate electrode of the thin film transistor used for the driver circuit is directly connected to a source wiring or a drain wiring, whereby a display device in which the number of contact holes can be reduced and an area occupied by the driver circuit is reduced can be provided.

The n-channel transistor included in the pixels of the display device obtained in Embodiment 3 can be manufactured by the method for manufacturing a semiconductor device described in Embodiment 1. That is, in patterning the channel protective film, back surface light exposure is performed using the gate electrode as a mask, whereby the channel protective layer is formed in a self-aligned manner. Accordingly, a defective shape or the like due to misalignment of a photomask does not occur and the channel protective layer can be formed with good controllability. Therefore, a highly reliable semiconductor device can be manufactured with a high yield. Further, the oxide semiconductor layer has a light-transmitting property, so that a photoresist can be efficiently exposed to light, the amount of the photoresist used in a photolithography process can be reduced, and time required for light exposure can be shortened, leading to improvement in productivity. Further, the channel protective layer functions as an etching stopper which protects a portion to be a channel formation region in the oxide semiconductor layer. Therefore, damage (reduction in film thickness, oxidation, or the like by plasma or an etchant in etching) to the surface of the oxide semiconductor layer by etching treatment in the patterning process of the conductive layer to be a wiring layer can be reduced. Accordingly, a semiconductor device having high electric characteristics can be manufactured.

Note that the contents described in each drawing in Embodiment 3 can be optionally combined with or replaced with the contents described in another embodiment as appropriate.

(Embodiment 4)

In Embodiment 4, an example in which the semiconductor device described in Embodiment 1 is applied to an active matrix light-emitting display device is described. As a display element included in a display device, a light-emitting element utilizing electroluminescence is described here. Light-emitting elements utilizing electroluminescence are classified according to the type of a light-emitting material, that is, an organic compound or an inorganic compound. In general, the former is referred to as an organic EL element, and the latter as an inorganic EL element.

In an organic EL element, voltage is applied to the light-emitting element, so that electrons are injected from an electrode into a layer including a light-emitting organic compound, and holes are injected from the other electrode into the layer including the light-emitting organic compound, and current flows. Then, by recombination of these carriers (electrons and holes), the light-emitting organic compound becomes an excited state, and light is emitted when the light-emitting organic compound returns to a ground state from the excited state. For the above-described mechanism, such a light-emitting element is referred to as a current excitation type light-emitting element.

Inorganic EL elements are classified into a dispersive inorganic EL element and a thin-film inorganic EL element. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are further sandwiched between electrodes. Light emission mechanism of the thin film inorganic EL element is local light emission, in which inner-shell electron transition of a metal ion is utilized. Note that description is made using an organic EL element as a light-emitting element.

Figure 12A:
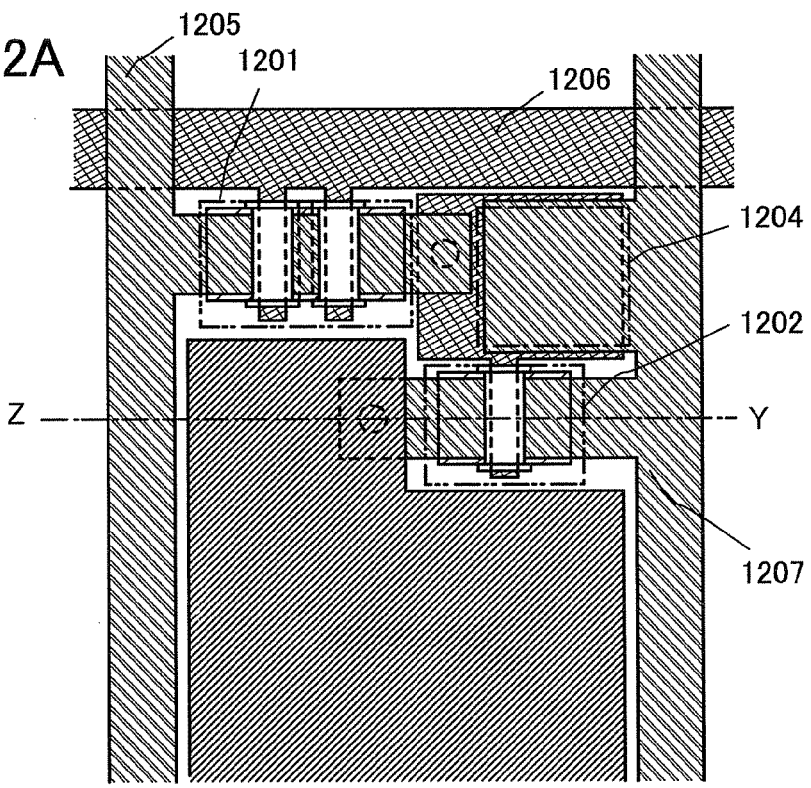
FIGS. 12A and 12B are diagrams illustrating Embodiment 4.
Figure 12B:
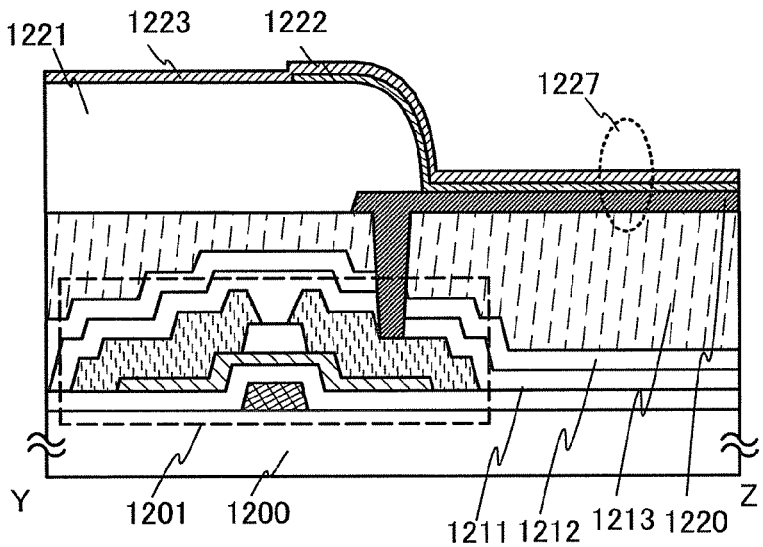
Figure 13:
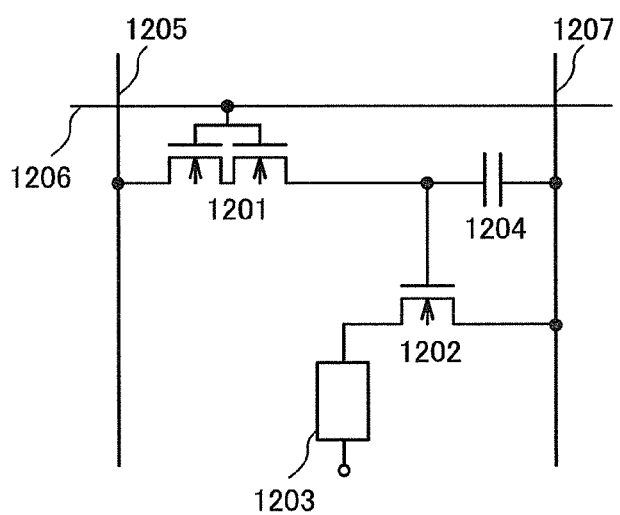
FIG. 13 is a diagram illustrating Embodiment 4.

FIGS. 12A and 12B illustrate an active matrix light-emitting display device as an example of a semiconductor device. FIG. 12A is a plan view of the light-emitting display device, and FIG. 12B is a cross-sectional view taken along line Y-Z of FIG. 12A. FIG. 13 shows an equivalent circuit of the light-emitting display device illustrated in FIGS. 12A and 12B.

Thin film transistors 1201 and 1202 used in the semiconductor device each can be manufactured in a manner similar to that of the thin film transistor described in Embodiment 1 or 2, and are highly reliable thin film transistors each including an In—Ga—Zn—O-based non-single-crystal film as an oxide semiconductor layer.

The light-emitting display device of Embodiment 4 illustrated in FIG. 12A and FIG. 13 includes the thin film transistor 1201 with a multi-gate structure, the thin film transistor 1202, a light-emitting element 1203, a capacitor 1204, a source wiring layer 1205, a gate wiring layer 1206, and a power source line 1207. The thin film transistors 1201 and 1202 are n-channel thin film transistors.

In FIG. 12B, the light-emitting display device of Embodiment 4 includes the thin film transistor 1202, an insulating layers 1211, an insulating layer 1212, an insulating layer 1213, a partition wall 1221; and a first electrode layer 1220, an electroluminescent layer 1222, and a second electrode layer 1223 which are used for a light-emitting element 1227.

The insulating layer 1213 is preferably formed using an organic resin such as acrylic, polyimide, or polyamide or siloxane.

Since the thin film transistor 1202 in the pixel is an n-channel transistor in Embodiment 4, the first electrode layer 1220 which is a pixel electrode layer is desirably a cathode. Specifically, as a cathode, a material with low work function, such as Ca, Al, CaF, MgAg, or AlLi, can be used.

The partition wall 1221 is formed using an organic resin film, an inorganic insulating film, or organic polysiloxane. It is particularly preferable that the partition wall 1221 be formed using a photosensitive material to have an opening portion over the first electrode layer 1220 so that a sidewall of the opening portion is formed as a tilted surface with continuous curvature.

The electroluminescent layer 1222 may be formed using a single layer or a plurality of layers stacked.

The second electrode layer 1223 is formed using an anode to cover the electroluminescent layer 1222. The second electrode layer 1223 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added. The second electrode layer 1223 may also be formed using a titanium nitride film or a titanium film as well as the above light-transmitting conductive film. The light-emitting element 1227 is formed in a manner in which the first electrode layer 1220, the electroluminescent layer 1222, and the second electrode layer 1223 are stacked. After that, a protective film may be formed over the second electrode layer 1223 and the partition wall 1221 in order to prevent entry of oxygen, hydrogen, moisture, carbon dioxide, or the like into the light-emitting element 1227. As the protective film, a silicon nitride film, a silicon nitride oxide film, a DLC film, or the like can be formed.

Further, in a practical case, it is preferable that the light-emitting display device completed to the state illustrated in FIG. 12B be packaged (sealed) with a protective film (such as a bonding film or an ultraviolet curable resin film) or a cover material with high air-tightness and little degasification so that the display device is not exposed to the outside air.

Next, a structure of a light-emitting element is described with reference to FIGS. 14A to 14C. A cross-sectional structure of a pixel is described by taking an n-channel driving TFT as an example. Driving TFTs 1401, 1411, and 1421 used for semiconductor devices illustrated in FIGS. 14A, 14B, and 14C, respectively, can be manufactured in a manner similar to that of the thin film transistor described in Embodiment 1 and are highly reliable thin film transistors each including an In—Ga—Zn—O-based non-single-crystal film as a semiconductor layer.

In order to extract light emission from the light-emitting element, at least one of the anode and the cathode is required to be transparent. The thin film transistor and the light-emitting element are formed over the substrate. A light-emitting element have a top emission structure in which light emission is extracted through the surface opposite to the substrate, a bottom emission structure in which light emission is extracted through the surface on the substrate side, or a dual emission structure in which light emission is extracted through the surface opposite to the substrate and the surface on the substrate side. Any of these emission structures can be applied to the light-emitting element.

A light-emitting element having the top emission structure is described with reference to FIG. 14A.

Figure 14A:
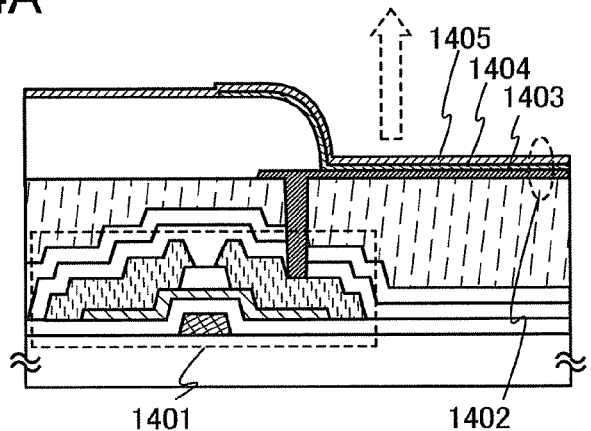
FIGS. 14A to 14C are diagrams illustrating Embodiment 4.
Figure 14B:
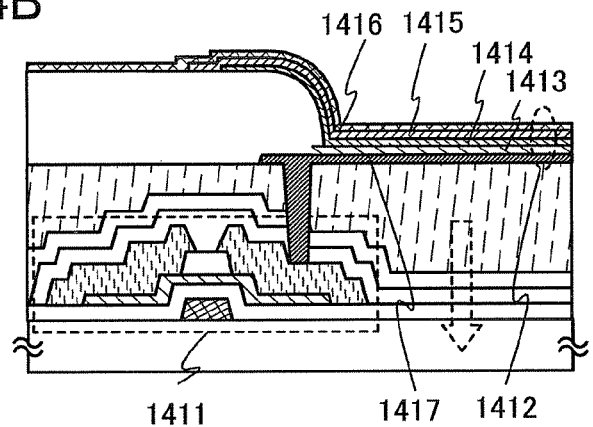
Figure 14C:
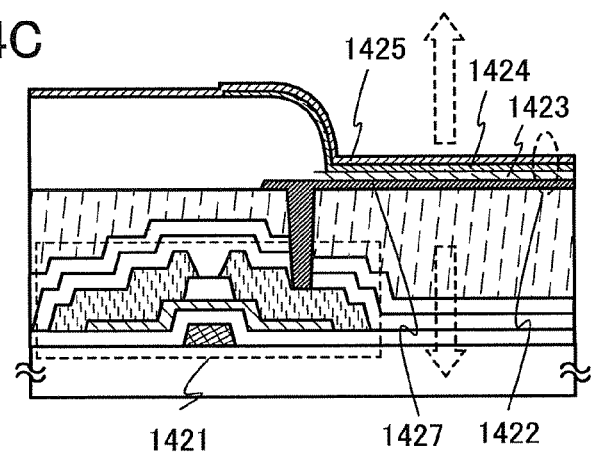

FIG. 14A is a cross-sectional view of a pixel in a case where a driving TFT 1401 is an n-channel TFT, and light generated in a light-emitting element 1402 is emitted to pass through an anode 1405. In FIG. 14A, a cathode 1403 of the light-emitting element 1402 is electrically connected to the driving TFT 1401, and a light-emitting layer 1404 and the anode 1405 are stacked over the cathode 1403 in this order. The cathode 1403 can be formed using any of a variety of conductive materials as long as it has a low work function and reflects light. For example, Ca, Al, CaF, MgAg, AlLi, or the like is desirably used. Further, the light-emitting layer 1404 may be formed using either a single layer or a stacked layer of a plurality of layers. When the light-emitting layer 1404 is formed to have a plurality of layers, an electron-injecting layer, an electron-transporting layer, a light-emitting layer, a hole-transporting layer, and a hole-injecting layer are stacked in this order over the cathode 1403. Note that it is not necessary to form all of these layers. The anode 1405 is formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

The light-emitting element 1402 corresponds to a region where the light-emitting layer 1404 is sandwiched between the cathode 1403 and the anode 1405. In the case of the pixel illustrated in FIG. 14A, light is emitted from the light-emitting element 1402 to the anode 1405 side as indicated by an arrow.

Next, a light-emitting element having the bottom emission structure is described with reference to FIG. 14B. FIG. 14B is a cross-sectional view of a pixel in a case where a driving TFT 1411 is an n-channel TFT, and light generated in a light-emitting element 1412 is emitted to pass through a cathode 1413. In FIG. 14B, the cathode 1413 of the light-emitting element 1412 is formed over a light-transmitting conductive film 1417 electrically connected to the driving TFT 1411, and a light-emitting layer 1414 and an anode 1415 are stacked over the cathode 1413 in this order. A light-blocking film 1416 for reflecting or blocking light may be formed so as to cover the anode when the anode 1415 has a light-transmitting property. As the cathode 1413, any of various materials can be used as in the case of FIG. 14A as long as the cathode 1413 is formed using a conductive material having a low work function. Note that the cathode 1413 has a thickness that enables transmission of light (preferably, about 5 nm to 30 nm). For example, an aluminum film having a thickness of 20 nm can be used as the cathode 1413. Similarly to the case of FIG. 14A, the light-emitting layer 1414 may be formed with either a single layer or a stacked layer of a plurality of layers. The anode 1415 does not necessarily transmit light therethrough, but can be formed using a light-transmitting conductive film as in the case of FIG. 14A. As the light-blocking film 1416, a metal or the like that reflects light can be used, for example; however, it is not limited to a metal film. For example, a resin to which black colorant is added can also be used.

A region where the light-emitting layer 1414 is sandwiched between the cathode 1413 and the anode 1415 corresponds to the light-emitting element 1412. In the pixel illustrated in FIG. 14B, light generated in the light-emitting element 1412 is emitted to pass through the cathode 1413 as indicated by an arrow.

Next, a light-emitting element having the dual emission structure is described with reference to FIG. 14C. In FIG. 14C, a cathode 1423 of a light-emitting element 1422 is formed over a light-transmitting conductive film 1427 which is electrically connected to a driving TFT 1421, and a light-emitting layer 1424 and an anode 1425 are stacked over the cathode 1423 in this order. As the cathode 1423, any of various materials can be used as in the case of FIG. 14A as long as the cathode 1423 is formed using a conductive material having a low work function. Note that the cathode 1423 has a thickness that enables transmission of light. For example, an Al film having a thickness of 20 nm can be used as the cathode 1423. Similarly to FIG. 14A, the light-emitting layer 1424 may be formed with either a single layer or a stacked layer of a plurality of layers. Similarly to FIG. 14A, the anode 1425 can be formed using a light-transmitting conductive material which transmits light.

A region where the cathode 1423, the light-emitting layer 1424, and the anode 1425 are stacked corresponds to the light-emitting element 1422. In the pixel illustrated in FIG. 14C, light generated in the light-emitting element 1422 is emitted to pass through both the anode 1425 and the cathode 1423 as indicated by arrows.

Although an organic EL element is described as a light-emitting element, it is also possible to provide an inorganic EL element as a light-emitting element.

In Embodiment 4, an example is described in which a thin film transistor for controlling the drive of a light-emitting element (the driving TFT) is electrically connected to the light-emitting element. However, a current control TFT may be formed between the driving TFT and the light-emitting element to be connected to them.

The n-channel transistor included in the pixel of the display device obtained in Embodiment 4 can be manufactured by the method for manufacturing a semiconductor device described in Embodiment 1. That is, in patterning the channel protective film, back surface light exposure is performed using the gate electrode as a mask, whereby the channel protective layer is formed in a self-aligned manner. Accordingly, a defective shape or the like due to misalignment of a photomask does not occur and the channel protective layer can be formed with good controllability. Therefore, a highly reliable semiconductor device can be manufactured with a high yield. Further, the oxide semiconductor layer has a light-transmitting property, so that a photoresist can be efficiently exposed to light, the amount of the photoresist used in a photolithography process can be reduced, and time required for light exposure can be shortened, leading to improvement in productivity. Further, the channel protective layer functions as an etching stopper which protects a portion to be a channel formation region in the oxide semiconductor layer. Therefore, damage (reduction in film thickness, oxidation, or the like by plasma or an etchant in etching) to the surface of the oxide semiconductor layer by etching treatment in the patterning process of the conductive layer to be a wiring layer can be reduced. Accordingly, a semiconductor device having high electric characteristics can be manufactured.

Note that the contents described in each drawing in Embodiment 4 can be optionally combined with or replaced with the contents described in another embodiment as appropriate.

(Embodiment 5)

In Embodiment 5, an example in which the semiconductor device described in Embodiment 1 or 2 is used in a display device referred to as electronic paper (also referred to as digital paper or a paper like display, and hereinafter, referred to as electronic paper) is described.

Figure 15:
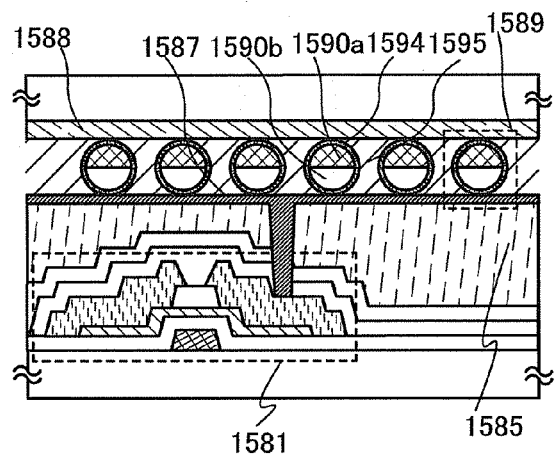
FIG. 15 is a diagram illustrating Embodiment 5.

FIG. 15 illustrates active matrix electronic paper as an example of a semiconductor device. A thin film transistor 1581 used for the semiconductor device can be manufactured in a manner similar to that of the thin film transistor described in Embodiment 1 and is a highly reliable thin film transistor including an In—Ga—Zn—O-based non-single-crystal film as an oxide semiconductor layer.

Electronic paper in FIG. 15 is an example of a display device using a twisting ball display system. The twisting ball display system refers to a method in which spherical particles each colored in black and white are arranged between a first electrode layer and a second electrode layer, and a potential difference is generated between the first electrode layer and the second electrode layer to control orientation of the spherical particles, so that display is performed.

The thin film transistor 1581 is an inverted staggered thin film transistor, and a source or drain electrode layer thereof is in contact with a first electrode layer 1587 through an opening formed in an insulating layer 1585, whereby the thin film transistor 1581 is electrically connected to the first electrode layer 1587. Between the first electrode layer 1587 and a second electrode layer 1588, spherical particles 1589, each of which includes a black region 1590a and a white region 1590b, and a cavity 1594 which is filled with liquid around the black region 1590a and the white region 1590b, are provided. A space around the spherical particle 1589 is filled with a filler 1595 such as a resin (see FIG. 15).

In FIG. 15, an electrode layer containing a light-transmitting conductive high molecule is used as the first electrode layer. An inorganic insulating film is provided over the first electrode layer 1587. The inorganic insulating film functions as a barrier film which prevents ionic impurities from diffusing from the first electrode layer 1587.

Instead of the twisting ball, an electrophoretic element can also be used. Because the electrophoretic element has higher reflectance than a liquid crystal display element, an auxiliary light is unnecessary, less power is consumed, and a display portion can be recognized even in a dim place. In addition, even when power is not supplied to the display portion, an image which has been displayed once can be maintained. Accordingly, a displayed image can be stored even if a chassis having a display portion is distanced from an electric wave source.

The n-channel transistor included in the electronic paper obtained in Embodiment 5 can be manufactured by the method for manufacturing a semiconductor device described in Embodiment 1 or 2. That is, in patterning the channel protective film, back surface light exposure is performed using the gate electrode as a mask, whereby the channel protective layer is formed in a self-aligned manner. Accordingly, a defective shape or the like due to misalignment of a photomask does not occur and the channel protective layer can be formed with good controllability. Therefore, a highly reliable semiconductor device can be manufactured with a high yield. Further, the oxide semiconductor layer has a light-transmitting property, so that a photoresist can be efficiently exposed to light, the amount of the photoresist used in a photolithography process can be reduced, and time required for light exposure can be shortened, leading to improvement in productivity. Further, the channel protective layer functions as an etching stopper which protects a portion to be a channel formation region in the oxide semiconductor layer. Therefore, damage (reduction in film thickness, oxidation, or the like by plasma or an etchant in etching) to the surface of the oxide semiconductor layer by etching treatment in the patterning process of the conductive layer to be a wiring layer can be reduced. Accordingly, a semiconductor device having high electric characteristics can be manufactured.

Note that the contents described in each drawing in Embodiment 5 can be optionally combined with or replaced with the contents described in another embodiment as appropriate.

(Embodiment 6)

Next, a structure of a display panel to which the semiconductor device described in Embodiment 1 is applied is described below. In Embodiment 6, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, are described.

Figure 16A:
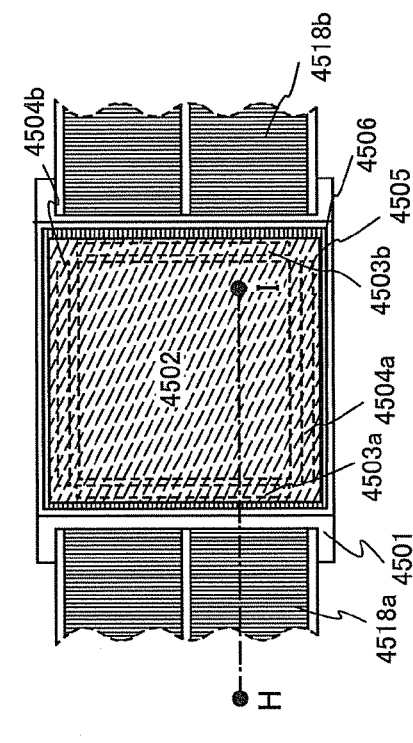
FIGS. 16A and 16B are diagrams illustrating Embodiment 6.
Figure 16B:
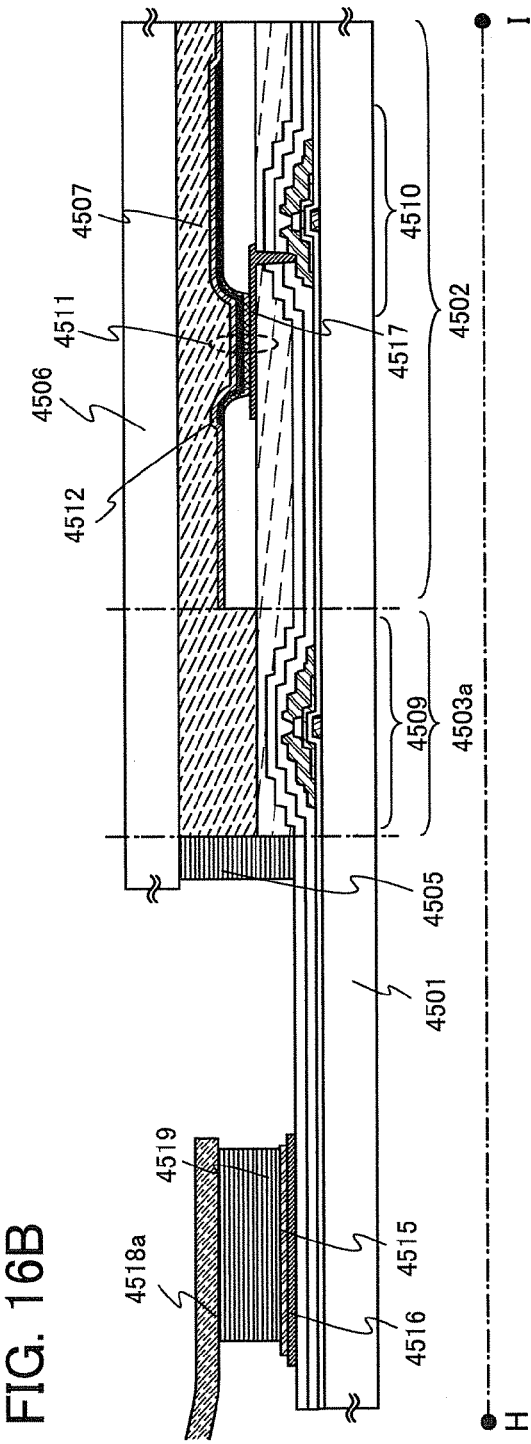

An external view and a cross section of the light-emitting display panel are described with reference to FIGS. 16A and 16B. FIG. 16A is a top view of a panel in which a highly reliable thin film transistor including an oxide semiconductor layer of 1n—Ga—Zn—O-based non-single crystal film, and a light-emitting element which are formed over a first substrate are sealed between the first substrate and a second substrate with a sealant. FIG. 16B corresponds to a cross-sectional view of FIG. 16A taken along line H-I.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507 by the first substrate 4501, the sealant 4505, and the second substrate 4506.

The pixel portion 4502, the signal line driver circuits 4503a and 4503b, and the scanning line driver circuits 4504a and 4504b which are provided over the first substrate 4501 each include a plurality of thin film transistors. FIG. 16B illustrates a thin film transistor 4510 included in the pixel portion 4502 and a thin film transistor 4509 included in the signal line driver circuit 4503a.

The thin film transistors 4509 and 4510 correspond to thin film transistors each including an oxide semiconductor layer of an In—Ga—Zn—O-based non-single-crystal film, to which the method for manufacturing a thin film transistor described in Embodiment 1 or 2 can be applied. In Embodiment 6, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that the structure of the light-emitting element 4511 is not limited to the structure described in Embodiment 6. The structure of the light-emitting element 4511 can be changed as appropriate depending on the direction in which light is extracted from the light-emitting element 4511 or the like.

A variety of signals and potentials are supplied to the signal line driver circuits 4503a and 4503b, the scanning line driver circuits 4504a and 4504b, or the pixel portion 4502 from FPCs 4518a and 4518b.

In Embodiment 6, a connection terminal 4515 is formed using the same conductive film as that of a second electrode layer 4512, and a wiring 4516 is formed using the same conductive film as that of the first electrode layer 4517 included in the light-emitting element 4511.

The connection terminal 4515 is electrically connected to a terminal included in the FPC 4518a through an anisotropic conductive film 4519.

The second substrate located in the direction in which light is extracted from the light-emitting element 4511 needs to have a light-transmitting property. In that case, a material with a light-transmitting property, such as a glass plate, a plastic sheet, a polyester film, or an acrylic film is used.

As the filler 4507, an ultraviolet curable resin or a thermosetting resin can be used in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In Embodiment 6, nitrogen is used as the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, anti-glare treatment may be carried out by which reflected light can be diffused by projections and depressions on the surface so as to reduce the glare.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or the scanning line driver circuits or part thereof may be separately formed and mounted. Embodiment 6 is not limited to the structure illustrated in FIGS. 16A and 16B.

Next, an external view and a cross section of a liquid crystal display panel are described with reference to FIGS. 17A, 17B, and 17C. Each of FIGS. 17A and 17B is a top view of a panel in which highly reliable thin film transistors 4010 and 4011 each including an oxide semiconductor layer of an In—Ga—Zn—O-based non-single-crystal film and a liquid crystal element 4013 which are formed over a first substrate 4001 are sealed between the first substrate 4001 and a second substrate 4006 with a sealant 4005. FIG. 17C is a cross-sectional view taken along line M-N of FIGS. 17A and 17B.

The sealant 4005 is provided to surround a pixel portion 4002 and a scanning line driver circuit 4004 which are provided over the first substrate 4001. In addition, the second substrate 4006 is provided over the pixel portion 4002 and the scanning line driver circuit 4004. Therefore, the pixel portion 4002 and the scanning line driver circuit 4004 are sealed together with a liquid crystal layer 4008 by the first substrate 4001, the sealant 4005, and the second substrate 4006. Further, a signal line driver circuit 4003 which is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 17A illustrates an example in which the signal line driver circuit 4003 is mounted by a COG method and FIG. 17B illustrates an example in which signal line driver circuit 4003 is mounted by a TAB method.

The pixel portion 4002 and the scanning line driver circuit 4004 which are provided over the first substrate 4001 each include a plurality of thin film transistors. FIG. 17C illustrates the thin film transistor 4010 included in the pixel portion 4002 and the thin film transistor 4011 included in the scanning line driver circuit 4004.

The thin film transistors 4010 and 4011 correspond to thin film transistors each including an oxide semiconductor layer of an In—Ga—Zn—O-based non-single-crystal film, to which the method for manufacturing a thin film transistor described in Embodiment 1 or 2 can be applied. In Embodiment 6, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 are stacked corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the second substrate 4006 may be formed using glass, metal (typically, stainless steel), ceramics, plastics, or the like. As plastic, a fiberglass-reinforced plastics (FRP) plate, a polyvinyl fluoride (PVF) film, a polyester film, or an acrylic resin film can be used. Further, sheet in which aluminum foil is sandwiched by PVF films or polyester films can also be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may be used.

In addition, a variety of signals and potentials is supplied to the signal line driver circuit 4003 that is formed separately, and the scanning line driver circuit 4004 or the pixel portion 4002 from an FPC 4018.

In Embodiment 6, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Although FIGS. 17A, 17B, and 17C illustrate an example in which the signal line driver circuit 4003 is formed separately and mounted on the first substrate 4001, Embodiment 6 is not limited to this structure. The scanning line driver circuit may be formed separately and then mounted, or only part of the signal line driver circuit or part of the scanning line driver circuit may be formed separately and then mounted.

Figure 18:
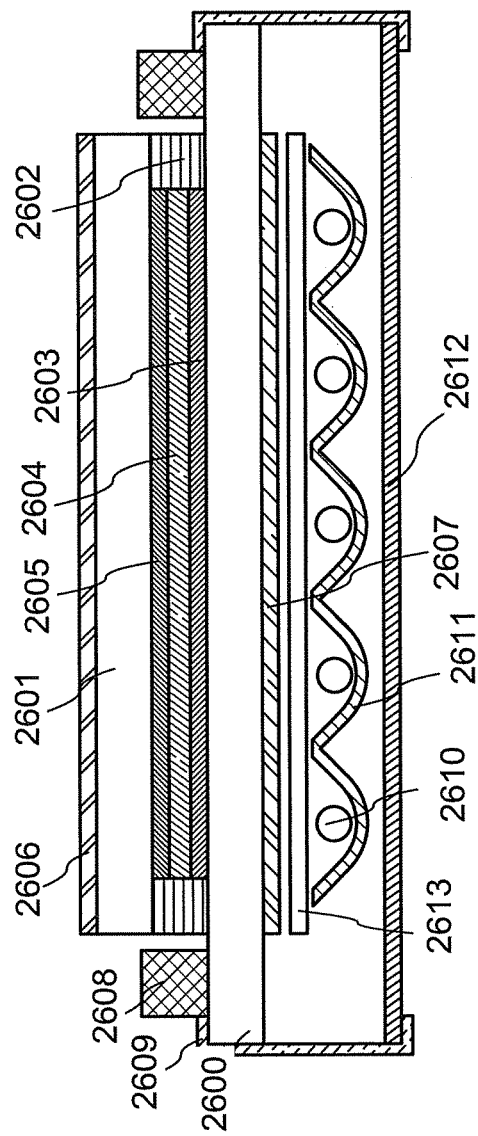
FIG. 18 is a diagram illustrating Embodiment 6.

FIG. 18 illustrates an example in which a liquid crystal display module is formed as a semiconductor device using a TFT substrate 2600 manufactured according to the present invention.

FIG. 18 shows an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, a coloring layer 2605, and a polarizing plate 2606 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffuser plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation film interposed therebetween.

The liquid crystal display module can use any of a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, and the like.

The display panel described above can be manufactured by the method for manufacturing a semiconductor device described in Embodiment 1 or 2. That is, in patterning the channel protective film, back surface light exposure is performed using the gate electrode as a mask, whereby the channel protective layer is formed in a self-aligned manner. Accordingly, a defective shape or the like due to misalignment of a photomask does not occur and the channel protective layer can be formed with good controllability. Therefore, a highly reliable semiconductor device can be manufactured with a high yield. Further, the oxide semiconductor layer has a light-transmitting property, so that a photoresist can be efficiently exposed to light, the amount of the photoresist used in a photolithography process can be reduced, and time required for light exposure can be shortened, leading to improvement in productivity. Further, the channel protective layer functions as an etching stopper which protects a portion to be a channel formation region in the oxide semiconductor layer. Therefore, damage (reduction in film thickness, oxidation, or the like by plasma or an etchant in etching) to the surface of the oxide semiconductor layer by etching treatment in the patterning process of the conductive layer to be a wiring layer can be reduced. Accordingly, a semiconductor device having high electric characteristics can be manufactured.

Note that the contents described in each drawing in Embodiment 6 can be optionally combined with or replaced with the contents described in another embodiment as appropriate.

(Embodiment 7)

In Embodiment 7, examples of electronic apparatuses provided with the display device of embodiments described above are described.

Figure 19A:
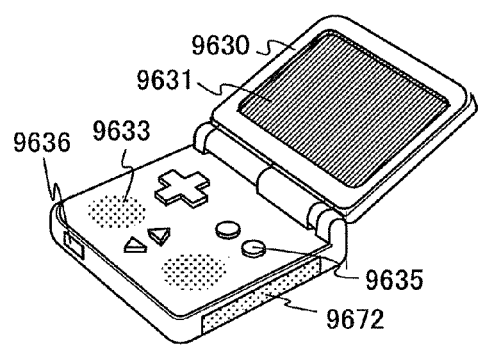
FIGS. 19A to 19C are diagrams illustrating Embodiment 7.

FIG. 19A illustrates a portable game machine, which includes a chassis 9630, a display portion 9631, a speaker 9633, operation keys 9635, a connection terminal 9636, a recording medium insert reading portion 9672, and the like. The portable game machine illustrated in FIG. 19A can have a function of reading a program or data stored in a recording medium to display on the display portion; a function of sharing information by wireless communication with another portable game machine; and the like. Note that the portable game machine illustrated in FIG. 19A can have a variety of functions without being limited to the above.

Figure 19B:
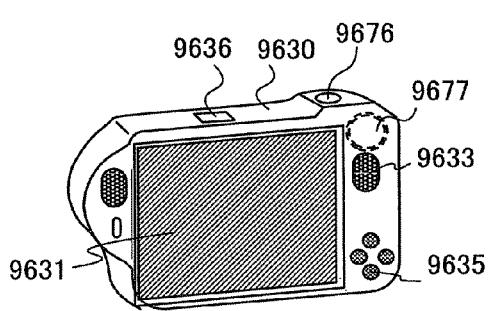

FIG. 19B illustrates a digital camera, which includes a chassis 9630, a display portion 9631, a speaker 9633, operation keys 9635, a connection terminal 9636, a shutter button 9676, an image receiving portion 9677, and the like. The digital camera having the television receiving function, which is illustrated in FIG. 19B, can have a function of photographing a still image; a function of shooting a moving image; a function of automatically or manually correcting the photographed image; a function of obtaining a variety of information from an antenna; a function of storing the photographed image or the information obtained from the antenna; a function of displaying the photographed image or the information obtained from the antenna on the display portion; and the like. Note that the digital camera having the television receiving function illustrated in FIG. 19B can have a variety of functions without being limited to the above.

Figure 19C:
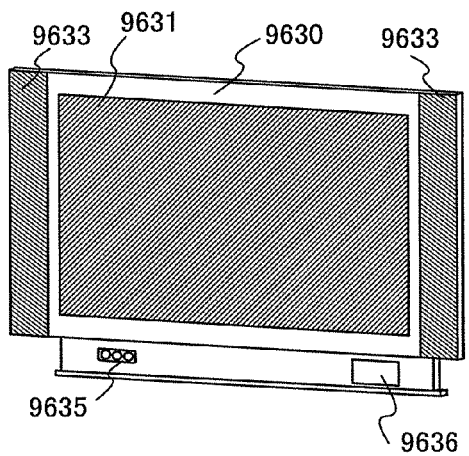

FIG. 19C illustrates a television receiver, which includes a chassis 9630, a display portion 9631, speakers 9633, operation keys 9635, a connection terminal 9636, and the like. The television receiver illustrated in FIG. 19C can have a function of processing an electric wave for television and converting the electric wave into a pixel signal; a function of processing the pixel signal and converting the pixel signal into a signal suitable for display; a function of converting a frame frequency of the pixel signal; and the like. Note that the television receiver illustrated in FIG. 19C can have a variety of functions without being limited to the above.

Figure 20A:
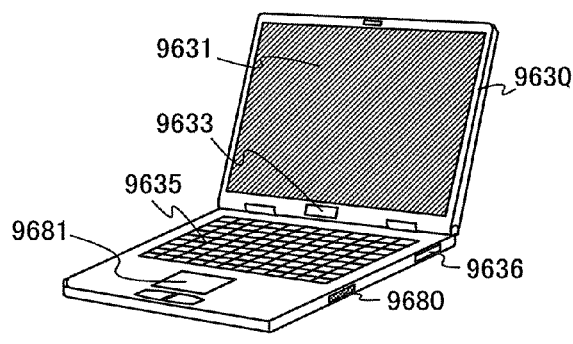
FIGS. 20A and 20B are diagrams illustrating Embodiment 7.

FIG. 20A illustrates a computer, which includes a chassis 9630, a display portion 9631, a speaker 9633, operation keys 9635, a connection terminal 9636, a pointing device 9681, an external connection port 9680, and the like. The computer illustrated in FIG. 20A can have a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; a function of transmitting or receiving various kinds of data by using the communication function; and the like. Note that the computer illustrated in FIG. 20A can have a variety of functions without being limited to the above.

Figure 20B:
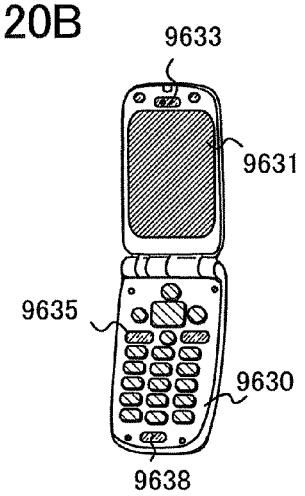

FIG. 20B illustrates a mobile phone, which includes a chassis 9630, a display portion 9631, a speaker 9633, operation keys 9635, a microphone 9638, and the like. The mobile phone illustrated in FIG. 20B can have a function of displaying various kinds of information (e.g, a still image, a moving image, and a text image); a function of displaying a calendar, the date, the time, and the like on the display portion; a function of operating or editing the information displayed on the display portion; a function of controlling processing by various kinds of software (programs); and the like. Note that the mobile phone illustrated in FIG. 20B can have a variety of functions without being limited to the above.

The thin film transistor in the display portion for displaying information, which is included in the electronic apparatus described in Embodiment 7, can be manufactured by the method for manufacturing a semiconductor device described in any of embodiments. That is, in patterning the channel protective film, back surface light exposure is performed using the gate electrode as a mask, whereby the channel protective layer is formed in a self-aligned manner. Accordingly, a defective shape or the like due to misalignment of a photomask does not occur and the channel protective layer can be formed with good controllability. Therefore, a highly reliable semiconductor device can be manufactured with a high yield. Further, the oxide semiconductor layer has a light-transmitting property, so that a photoresist can be efficiently exposed to light, the amount of the photoresist used in a photolithography process can be reduced, and time required for light exposure can be shortened, leading to improvement in productivity. Further, the channel protective layer functions as an etching stopper which protects a portion to be a channel formation region in the oxide semiconductor layer. Therefore, damage (reduction in film thickness, oxidation, or the like by plasma or an etchant in etching) to the surface of the oxide semiconductor layer by etching treatment in the patterning process of the conductive layer to be a wiring layer can be reduced. Accordingly, a semiconductor device having high electric characteristics can be manufactured.

Note that the contents described in each drawing in Embodiment 7 can be optionally combined with or replaced with the contents described in another embodiment as appropriate.

This application is based on Japanese Patent Application serial no. 2008-323297 filed with the Japan Patent Office on Dec. 19, 2008, the entire contents of which are hereby incorporated by reference.

Explanation of Reference

100: substrate, 101: gate electrode layer, 102: gate insulating film, 103: oxide semiconductor layer, 104: insulating layer, 105: photoresist, 106: light source, 107: light, 108: unexposed region, 109: exposed region, 110: channel protective layer, 111: wiring layer, 201: layer, 203: oxide semiconductor layer, 210: channel protective layer, 211: layer, 301a: buffer layer, 301b: buffer layer, 400: substrate, 401: gate electrode layer, 402, gate insulating film, 405a: source electrode layer, 405b: drain electrode layer, 407: protective insulating layer, 408: capacitor wiring, 409: oxide semiconductor layer, 410: pixel electrode layer, 411: channel protective layer, 420: connection electrode, 421: terminal, 422: terminal, 425: contact hole, 426: contact hole, 427: contact hole, 428: transparent conductive film, 429: transparent conductive film, 431, resist mask, 432: conductive film, 450: terminal, 451: terminal, 452, gate insulating film, 453: connection electrode, 454: protective insulating film, 455: transparent conductive film, 456: electrode, 470: thin film transistor, 475: insulating film, 491: insulating film, 492: insulating film, 1201: thin film transistor, 1202: thin film transistor, 1203: light-emitting element, 1204: capacitor, 1205: source wiring layer, 1206: gate wiring layer, 1207: power source line, 1211, insulating layer, 1212: insulating layer, 1213: insulating layer, 1220: electrode layer, 1221: partition wall, 1222: electroluminescent layer, 1223: electrode layer, 1227: light-emitting element, 1401: driver TFT, 1402: light-emitting element, 1403: cathode, 1404: light-emitting layer, 1405: anode, 1411: driver TFT, 1412: light-emitting element, 1413: cathode, 1414: light-emitting layer, 1415: anode, 1416: light-blocking film, 1417: conductive film, 1421: driver TFT, 1422: light-emitting element, 1423: cathode, 1424: light-emitting layer, 1425: anode, 1427: conductive film, 1581: thin film transistor, 1585: insulating layer, 1587: electrode layer, 1588: electrode layer, 1589: spherical particle, 1590a: black region, 1590b: white portion, 1594: cavity, 1595: filler, 2100: substrate, 2101: gate electrode, 2102: gate insulating film, 2103: oxide semiconductor layer, 2104: insulating layer, 2105: photoresist, 2106: light source, 2107: light, 2108: unexposed region, 2109: exposed region, 2110: channel protective layer, 2111: oxide semiconductor layer, 2112: wiring layer, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffuser plate, 4001: substrate, 4002: pixel portion, 4003: signal line driver circuit, 4004: scanning line driver circuit, 4005 sealant, 4006: substrate, 4008: liquid crystal layer, 4010: thin film transistor, 4011: thin film transistor, 4013: liquid crystal element, 4015: connection terminal, 4016: wiring, 4018: FPC, 4019: anisotropic conductive film, 4030: pixel electrode layer, 4031: counter electrode layer, 4032: insulating layer, 4501: substrate, 4502: pixel portion, 4503a: signal driver circuit, 4504a: scanning line driver circuit, 4505: sealant, 4506: substrate, 4507: filler, 4509: thin film transistor, 4510: thin film transistor, 4511: light-emitting element, 4512: electrode layer, 4515: connection terminal, 4516: wiring, 4517: electrode layer, 4518a: FPC, 4519: anisotropic conductive film, 9630: chassis, 9631: display portion, 9633: speaker, 9635: operation key, 9636: connection terminal, 9638: microphone, 9672: recording medium insert reading portion, 9676: shutter button, 9677: image receiving portion, 9680: external connection port, 9681: pointing device.

The invention claimed is:

1. A method for manufacturing a semiconductor device, comprising the steps of:

forming a gate electrode layer having a light-blocking property over a first surface of a substrate;

forming a gate insulating film over the gate electrode layer;

forming an island-shaped oxide semiconductor layer having a light-transmitting property over the gate insulating film;

forming an insulating layer over the island-shaped oxide semiconductor layer;

forming a positive photosensitive thin film over the insulating layer;

performing light exposure on the positive photosensitive thin film by irradiation with light from a side of the substrate opposite to the first surface;

removing an exposed region of the positive photosensitive thin film by development;

forming a channel protective layer by etching the insulating layer with the use of an unexposed region of the positive photosensitive thin film as a mask; and forming a wiring layer over the island-shaped oxide semiconductor layer.

2. The method for manufacturing a semiconductor device according to claim 1, wherein the substrate has a light-transmitting property.

3. The method for manufacturing a semiconductor device according to claim 1, wherein the gate insulating film has a light-transmitting property.

4. The method for manufacturing a semiconductor device according to claim 1, wherein the insulating layer has a light-transmitting property.

5. The method for manufacturing a semiconductor device according to claim 1, wherein the island-shaped oxide semiconductor layer is a thin film represented by $InMO_3(ZnO)_m$ (m>0) and M denotes one or more of gallium, iron, nickel, manganese, and cobalt.

6. The method for manufacturing a semiconductor device according to claim 1, wherein reverse sputtering using an argon gas is performed on a surface of the gate insulating film before formation of the island-shaped oxide semiconductor layer.

7. The method for manufacturing a semiconductor device according to claim 1, wherein heat treatment at 200° C. to 600° C. is performed on the island-shaped oxide semiconductor layer.

8. The method for manufacturing a semiconductor device according to claim 7, wherein the heat treatment is performed in an air atmosphere or a nitrogen atmosphere.

9. The method for manufacturing a semiconductor device according to claim 1, wherein the channel protective layer is an insulating film including oxygen.

10. The method for manufacturing a semiconductor device according to claim 1, wherein the island-shaped oxide semiconductor layer is formed by etching an oxide semiconductor layer.

11. The method for manufacturing a semiconductor device according to claim 10, wherein the oxide semiconductor layer is formed by a sputtering method.

12. A semiconductor device manufactured by the method for manufacturing a semiconductor device according to claim 1.

13. An electronic apparatus comprising the semiconductor device according to claim 12.

* * * * *